US012751157B2

(12) United States Patent
Bang et al.

(10) Patent No.: US 12,751,157 B2
(45) Date of Patent: Sep. 29, 2026

(54) DISPLAY APPARATUS INCLUDING A COVER LAYER COVERING A CONDUCTIVE PATTERN IN A PERIPHERAL AREA AND METHOD OF MANUFACTURING THE SAME

(71) Applicant: Samsung Display Co., Ltd., Yongin-si (KR)

(72) Inventors: Kiho Bang, Yongin-si (KR); Wonsuk Choi, Yongin-si (KR); Eunhye Kim, Yongin-si (KR); Eunae Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 767 days.

(21) Appl. No.: 18/166,366

(22) Filed: Feb. 8, 2023

(65) Prior Publication Data

US 2023/0263022 A1 Aug. 17, 2023

(30) Foreign Application Priority Data

Feb. 17, 2022 (KR) ........................ 10-2022-0021038

(51) Int. Cl.
*H10K 59/131* (2023.01)
*G09G 3/3233* (2016.01)
(Continued)

(52) U.S. Cl.
CPC ......... *H10K 59/131* (2023.02); *G09G 3/3233* (2013.01); *H10K 59/1201* (2023.02);
(Continued)

(58) Field of Classification Search
CPC ............. H10K 59/131; H10K 59/1201; H10K 59/873; G09G 3/3233; G09G 2300/0819; G09G 2300/0842
(Continued)

(56) References Cited

U.S. PATENT DOCUMENTS 11,043,551 B2 6/2021 Shin et al.
11,424,422 B2 8/2022 Choi et al.
(Continued)

FOREIGN PATENT DOCUMENTS

KR 10-2017-0115149 A 10/2017
KR 10-2018-0058265 A 6/2018
(Continued)

OTHER PUBLICATIONS

Extended European Search Report for Application No. 23156945.0, mailed Jun. 1, 2023, 9 pages.

*Primary Examiner* — Eric W Jones
(74) *Attorney, Agent, or Firm* — Womble Bond Dickinson (US) LLP

(57) ABSTRACT

A display apparatus includes a substrate including a display area and a peripheral area outside the display area, the peripheral area including an adhesion area, a conductive pattern in the adhesion area, a cover layer covering at least a portion of an upper surface of the conductive pattern and a side surface of the conductive pattern, and an encapsulation layer in the display area and the peripheral area and including a first inorganic encapsulation layer, an organic encapsulation layer, and a second inorganic encapsulation layer, wherein the first inorganic encapsulation layer directly contacts the cover layer and the second inorganic encapsulation layer in the adhesion area.

19 Claims, 24 Drawing Sheets

(51) Int. Cl.
*H10K 59/12* (2023.01)
*H10K 59/80* (2023.01)

(52) U.S. Cl.
CPC ... *H10K 59/873* (2023.02); *G09G 2300/0819* (2013.01); *G09G 2300/0842* (2013.01)

(58) Field of Classification Search
USPC .......................... 257/40, 59, 88, 91, 99, 100
See application file for complete search history.

(56) References Cited

U.S. PATENT DOCUMENTS

| | | | | |
|---|---|---|---|---|
| 2014/0209914 | A1 | 7/2014 | Nagasawa et al. | |
| 2019/0103455 | A1* | 4/2019 | Song | H10K 59/131 |
| 2019/0288234 | A1* | 9/2019 | Kim | H10K 59/122 |
| 2020/0006461 | A1* | 1/2020 | Cho | H10K 59/1315 |
| 2020/0219952 | A1 | 7/2020 | Kim et al. | |
| 2021/0005697 | A1* | 1/2021 | Kang | H10K 59/88 |
| 2021/0035496 | A1 | 2/2021 | Cho et al. | |
| 2021/0091320 | A1 | 3/2021 | Choi et al. | |
| 2021/0336214 | A1 | 10/2021 | Bang et al. | |

FOREIGN PATENT DOCUMENTS

| | | | |
|---|---|---|---|
| KR | 10-2021-0014810 | A | 2/2021 |
| KR | 10-2021-0035959 | A | 4/2021 |
| KR | 10-2021-0066555 | A | 6/2021 |
| KR | 10-2021-0131507 | A | 11/2021 |

* cited by examiner

DISPLAY APPARATUS INCLUDING A COVER LAYER COVERING A CONDUCTIVE PATTERN IN A PERIPHERAL AREA AND METHOD OF MANUFACTURING THE SAME

CROSS-REFERENCE TO RELATED APPLICATION

This application claims priority to and the benefit of Korean Patent Application No. 10-2022-0021038, filed on Feb. 17, 2022, in the Korean Intellectual Property Office, the entire disclosure of which is incorporated by reference herein.

BACKGROUND

1. Field

Embodiments of the present disclosure relate to a display apparatus and a method of manufacturing the same.

2. Description of the Related Art

As the information society advances, various demands for display apparatuses for displaying images have increased. Moreover, display apparatuses have become thinner and lighter, and thus, the usage thereof has expanded.

Techniques to decrease a peripheral area, a so-called dead space, have been developed in order to increase a size of a display area in a display apparatus.

SUMMARY

According to one to more embodiments of the present disclosure, a display apparatus may have a reduced dead space and display a high-quality image. However, the scope of the present disclosure is not limited to this effect as described above.

Additional aspects will be set forth in part in the description which follows and, in part, will be apparent from the description or may be learned by practice of the embodiments of the present disclosure.

According to one or more embodiments of the present disclosure, a display apparatus includes a substrate including a display area and a peripheral area outside the display area, the peripheral area including an adhesion area, a conductive pattern in the adhesion area, a cover layer covering at least a portion of an upper surface of the conductive pattern and a side surface of the conductive pattern, and an encapsulation layer in the display area and the peripheral area, the encapsulation layer including a first inorganic encapsulation layer, an organic encapsulation layer, and a second inorganic encapsulation layer, wherein the first inorganic encapsulation layer directly contacts the cover layer and the second inorganic encapsulation layer in the adhesion area.

In one or more embodiments, the conductive pattern may extend in a first direction, and the conductive pattern may include protrusion patterns protruding in a second direction crossing the first direction.

In one or more embodiments, the display apparatus may further include a dam portion and a bank in the peripheral area, wherein the adhesion area is between the dam portion and the bank.

In one or more embodiments, the display apparatus may further include a first connection pattern in the display area, a first organic insulating layer on the first connection pattern, a second connection pattern on the first organic insulating layer, a second organic insulating layer on the second connection pattern, a third connection pattern on the second organic insulating layer, and a third organic insulating layer on the third connection pattern.

In one or more embodiments, the conductive pattern may be at a same layer as the first connection pattern, the second connection pattern, or the third connection pattern.

In one or more embodiments, the conductive pattern may be at a same layer as the first connection pattern.

In one or more embodiments, the conductive pattern may include a first conductive layer, a second conductive layer, and a third conductive layer that are sequentially stacked, the first connection pattern may include a first layer, a second layer, and a third layer that are sequentially stacked, and the first conductive layer, the second conductive layer, and the third conductive layer may be at same layers and may include same materials as the first layer, the second layer, and the third layer, respectively.

In one or more embodiments, the cover layer may cover a side surface of the first conductive layer, a side surface of the second conductive layer, a side surface of the third conductive layer, and at least a portion of an upper surface of the third conductive layer.

In one or more embodiments, the third conductive layer and the cover layer may include a same material as each other.

In one or more embodiments, the second connection pattern may include a fourth layer, a fifth layer, and a sixth layer that are sequentially stacked, and the cover layer may include a same material as the fourth layer.

According to one or more embodiments of the present disclosure, a method of manufacturing a display apparatus including a display area and a peripheral area outside the display area, the peripheral area including an adhesion area, includes forming a first pattern material in the display area and the adhesion area, forming a first connection pattern by etching the first pattern material in the display area and forming a conductive pattern by etching the first pattern material in the adhesion area, forming a first organic insulating layer on the first connection pattern, forming a second pattern material on the first organic insulating layer and the conductive pattern, forming a second connection pattern by etching the second pattern material on the first organic insulating layer and forming a protection layer by etching the second pattern material on the conductive pattern, and removing a portion of the protection layer.

In one or more embodiments, the protection layer may include a cover layer, a first protection layer, and a second protection layer that are sequentially stacked in a thickness direction of a substrate.

In one or more embodiments, the removing of the portion of the protection layer may include forming a second organic insulating layer on the second connection pattern, forming a third pattern material on the second organic insulating layer and the protection layer, forming a third connection pattern by etching the third pattern material on the second organic insulating layer and removing the third pattern material on the protection layer, the second protection layer of the protection layer, and a portion of the first protection layer of the protection layer, forming a third organic insulating layer on the third connection pattern, forming a fourth pattern material on the third organic insulating layer and the first protection layer, and forming a pixel electrode by etching the fourth pattern material on the third organic insulating layer and removing the fourth pattern material on the first protection layer and remaining portions of the first protection layer.

In one or more embodiments, the cover layer and the second protection layer may include the same material as each other, and the cover layer and the first protection layer may include different materials from each other.

In one or more embodiments, the method may further include, after removing the portion of the protection layer, forming a first inorganic encapsulation layer and a second inorganic encapsulation layer on the cover layer.

In one or more embodiments, the first inorganic encapsulation layer in the adhesion area may directly contact the cover layer and the second inorganic encapsulation layer.

In one or more embodiments, the conductive pattern may extend in a first direction, and the conductive pattern may include protrusion patterns protruding in a second direction crossing the first direction.

In one or more embodiments, the conductive pattern may include a first conductive layer, a second conductive layer, and a third conductive layer that are sequentially stacked, and the cover layer may cover a side surface of the first conductive layer, a side surface of the second conductive layer, a side surface of the third conductive layer, and at least a portion of an upper surface of the third conductive layer.

In one or more embodiments, the cover layer and the third conductive layer may include a same material as each other.

In one or more embodiments, the method may further include a dam portion and a bank in the peripheral area, wherein the adhesion area is between the dam portion and the bank.

BRIEF DESCRIPTION OF THE DRAWINGS

The above and other aspects, features, and/or principles of various embodiments of the present disclosure will be more apparent from the following description taken in conjunction with the accompanying drawings, in which.

DETAILED DESCRIPTION

Figure 1:
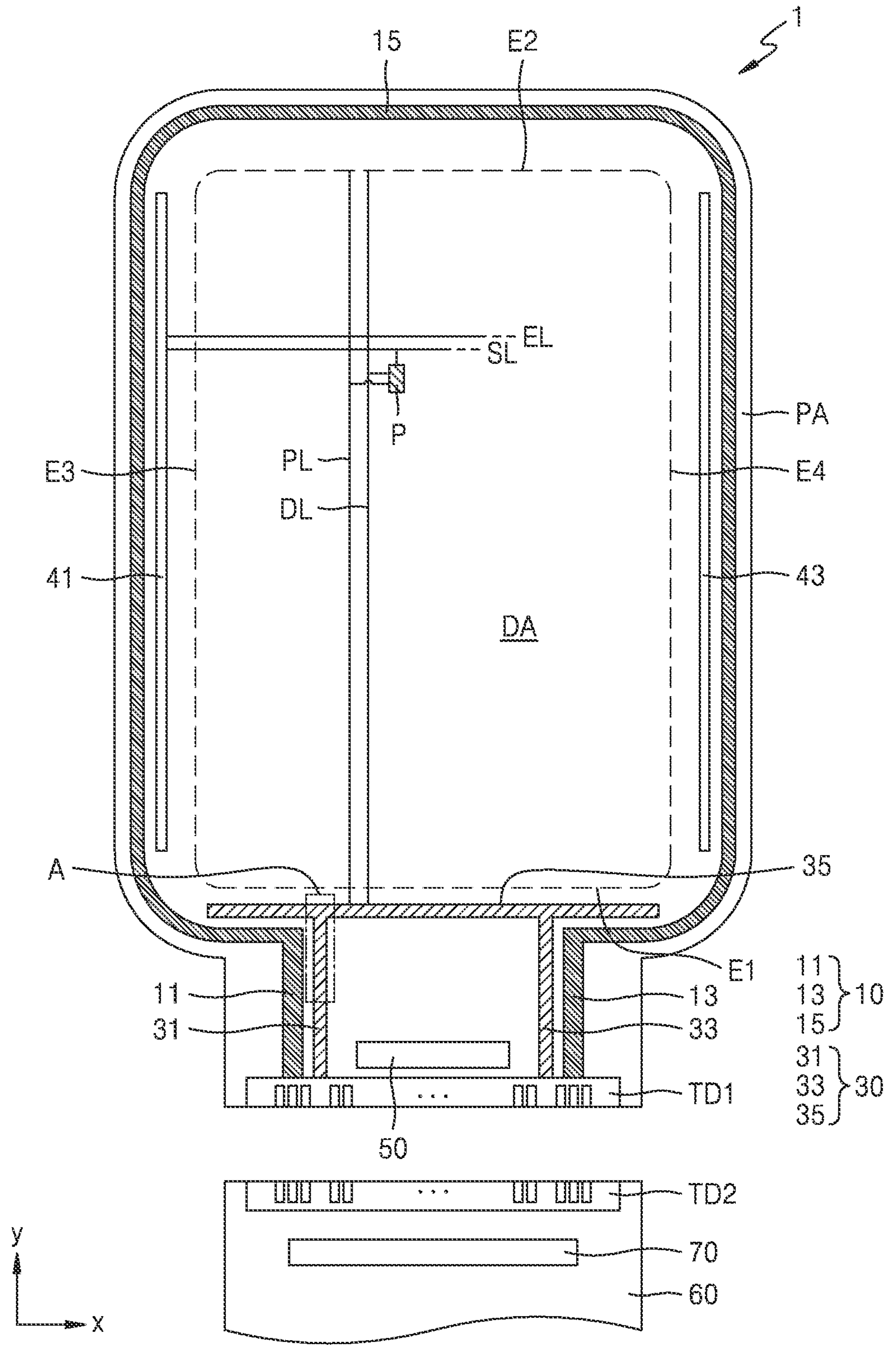
FIG. 1 is a schematic plan view of a portion of a display apparatus according to one or more embodiments of the present disclosure.

Reference will now be made in detail to the embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or variations thereof.

While the present disclosure is capable of various modifications and alternative forms, embodiments thereof are shown by way of example in the drawings and will herein be described in detail. Effects and characteristics of the present disclosure, and realized methods thereof will become apparent by referring to the drawings and embodiments described in detail below. Accordingly, processes, elements, and techniques that are not necessary to those having ordinary skill in the art for a complete understanding of the aspects and features of the present disclosure may not be described. However, the present disclosure is not limited to the embodiments disclosed hereinafter and may be realized in various forms.

It will be understood that although the terms "first," "second," etc. may be used herein to describe various components, these components should not be limited by these terms. These terms are only used to distinguish one component from another.

As used herein, the singular expressions "a," "an," and "the" are intended to include the plural forms as well, unless the context clearly indicates otherwise.

It will be further understood that the terms "include," "including," "comprises" and/or "comprising" used herein specify the presence of stated features or components, but do not preclude the presence or addition of one or more other features or components.

It will be understood that when a layer, region, or element is referred to as being formed "on," "connected to," or "coupled to" another layer, area, or element, it can be directly or indirectly formed on, connected to, or coupled to the other layer, region, or element. That is, for example, intervening layers, regions, or elements may be present. In addition, it will also be understood that when an element or layer is referred to as being "between" two elements or layers, it can be the only element or layer between the two elements or layers, or one or more intervening elements or layers may also be present.

Sizes of elements in the drawings may be exaggerated for convenience of explanation. For example, sizes and thicknesses of the elements in the drawings are indicated for convenience of explanation, and thus, the disclosure is not necessarily limited to the illustrations of the drawings.

In this specification, the expression “A and/or B” may indicate A, B, or A and B. Also, in this specification, the expression “at least one of A and B” may indicate A, B, or A and B.

In embodiments described hereinafter, “lines extending in a first direction or a second direction” denotes not only the lines extending as a linear shape, but also the lines extending in the first direction or the second direction as a zig-zag shape or a circular shape.

In the embodiments hereinafter, the expression “planar” indicates a shape when an object is seen downwardly, and the expression “cross-sectional” indicates a shape when an object, which is vertically taken, is seen from the lateral perspective. In the embodiments below, when a part is referred to as “overlapping,” the part may be “planarly” or “cross-sectionally” overlapping.

Spatially relative terms, such as “beneath,” “below,” “lower,” “under,” “above,” “upper,” and the like, may be used herein for ease of explanation to describe one element or feature’s relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as “below” or “beneath” or “under” other elements or features would then be oriented “above” the other elements or features. Thus, the example terms “below” and “under” can encompass both an orientation of above and below. The device may be otherwise oriented (e.g., rotated 90 degrees or at other orientations) and the spatially relative descriptors used herein should be interpreted accordingly.

As used herein, the term “substantially,” “about,” and similar terms are used as terms of approximation and not as terms of degree, and are intended to account for the inherent deviations in measured or calculated values that would be recognized by those of ordinary skill in the art. Further, the use of “may” when describing embodiments of the present disclosure refers to “one or more embodiments of the present disclosure.” As used herein, the terms “use,” “using,” and “used” may be considered synonymous with the terms “utilize,” “utilizing,” and “utilized,” respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments of the present disclosure will be described in detail with reference to the accompanying drawings. Also, when the descriptions are given by referring to the drawings, the same elements or the corresponding elements will be referred to by using the same reference numerals.

FIG. 1 is a schematic plan view of a display apparatus according to one or more embodiments. A plan view, as used in the present specification, may correspond to a state in which the device or portion of the device is viewed in a z-direction.

Referring to FIG. 1, the display apparatus may include a display panel 1. The display apparatus may refer to all types of display apparatuses that include the display panel 1 described in more detail below. For example, the display apparatus may include various products, such as a smartphone, a tablet, a laptop, a television, or an advertising board.

The display panel 1 may include a display area DA and a peripheral area PA outside the display area DA. The display area DA is configured to display an image, and a plurality of pixels P may be arranged in the display area DA. From a direction approximately perpendicular to the display panel 1 (e.g., in a plan view), the display area DA may have various shapes including a circular shape, an oval shape, a polygonal shape, and/or any other suitable shape (e.g., a predetermined shape). FIG. 1 illustrates that the display area DA may approximately have a square shape. However, the present disclosure is not limited thereto. For example, the display area DA may approximately have a round-edged square shape.

The peripheral area PA may be arranged outside the display area DA. The peripheral area PA may completely surround (or may be around) the display area DA. The peripheral area PA is configured to not display an image, and driving circuits, lines, etc. configured to drive the pixels P in the display area DA may be arranged in the peripheral area PA.

According to one or more embodiments, at least a portion of the peripheral area PA, the portion being at a lower portion of the display area DA, may be bent. When the display panel 1 is bent, the peripheral area PA, which is a non-display area, may not be visible, when viewing the display apparatus, or even when the peripheral area PA is visible, a visible area thereof may be minimized.

A shape of the display panel 1 described above may be substantially the same as a shape of the substrate 100. For example, it may be understood that the substrate 100 may include the display area DA and the peripheral area PA. Hereinafter, for convenience, it is described that the substrate 100 may include the display area DA and the peripheral area PA.

The pixel P may be arranged in the display area DA and may emit red, green, and/or blue light. For example, the pixel P may emit a desirable color (e.g., a predetermined color) of light by using a light-emitting diode configured to emit light. The light-emitting diode may include an organic light-emitting diode, an inorganic light-emitting diode, or a quantum dot light-emitting diode. Hereinafter, for convenience of explanation, it is described that the light-emitting diode may correspond to an organic light-emitting diode.

The light-emitting diode may be connected to transistors that are connected to signal lines or a voltage line configured to control on/off and brightness of the light-emitting diode. Regarding this aspect, FIG. 1 illustrates the signal lines connected to the transistors, such as a scan line SL, an emission control line EL, a data line DL, and the voltage line, such as a driving voltage line PL. In the peripheral area PA, a common voltage supply line 10, a driving voltage supply line 30, a first driving circuit 41, a second driving circuit 43, and a data driving circuit 50 may be arranged.

The common voltage supply line 10 may be arranged in the peripheral area PA. The common voltage supply line 10 may include a first common voltage supply line 11, a second common voltage supply line 13, and a body portion 15. The first common voltage supply line 11 and the second common voltage supply line 13 may be arranged adjacent to a first edge E1 of the display area DA. The first common voltage supply line 11 and the second common voltage supply line 13 may extend in a first direction (for example, a y direction). Also, the first common voltage supply line 11 and the second common voltage supply line 13 may be arranged apart from each other in a second direction (for example, an x direction) crossing the first direction (for example, the y direction). The first common voltage supply line 11 and the second common voltage supply line 13 may be arranged at both sides of the first edge E1 of the display area DA, respectively (e.g., the first common voltage supply line 11 may be at one side of the first edge E1 and the second common voltage supply line 13 may be at the other side of the first edge E1). However, the present disclosure is not limited thereto. The common voltage supply line 10 may further include a third common voltage supply line arranged between the first common voltage supply line 11 and the second common voltage supply line 13. When the common voltage supply line 10 includes the third common voltage supply line arranged between the first common voltage supply line 11 and the second common voltage supply line 13, the common voltage supply line 10 may further reduce a current density when applying currents and may further suppress (or reduce) heating, compared to when the common voltage supply line 10 includes only the first common voltage supply line 11 and the second common voltage supply line 13.

The first common voltage supply line 11 and the second common voltage supply line 13 may be connected with each other via the body portion 15 extending along a second edge E2, a third edge E3, and a fourth edge E4 of the display area DA. According to one or more embodiments, the first common voltage supply line 11, the second common voltage supply line 13, and the body portion 15 may be integrally formed.

According to one or more embodiments, the driving voltage supply line 30 may include a first driving voltage supply line 31, a second driving voltage supply line 33, and a third driving voltage supply line 35. The first driving voltage supply line 31 and the second driving voltage supply line 33 may extend in the first direction (for example, the y direction), and the third driving voltage line 35 may extend in the second direction (for example, the x direction). For example, the third driving voltage supply line 35 may be arranged along the first edge E1 of the display area DA. According to one or more embodiments, the first driving voltage supply line 31, the second driving voltage supply line 33, and the third driving voltage supply line 35 may be integrally formed. However, the present disclosure is not limited thereto.

The driving voltage supply line 30 may be arranged in the peripheral area PA and may be electrically connected to the driving voltage line PL crossing the display area DA in the first direction (for example, the y direction). That is, the third driving voltage supply line 35 may be electrically connected to the driving voltage line PL crossing the display area DA in the first direction (for example, the y direction).

The first driving circuit 41 and the second driving circuit 43 may be arranged in the peripheral area PA and may be electrically connected to the scan lines SL and/or the emission control line EL. According to one or more embodiments, some of the scan lines SL may be electrically connected to the first driving circuit 41, and the others may be electrically connected to the second driving circuit 43. The first driving circuit 41 and the second driving circuit 43 may be configured to generate a scan signal, and the generated scan signal may be transmitted to the transistor electrically connected to the light-emitting diode through the scan lines SL. According to one or more embodiments, any one of the first and second driving circuits 41 and 43 may include an emission control driving circuit. For example, as illustrated in FIG. 1, the first driving circuit 41 may include an emission control driving circuit and may be configured to transmit an emission control signal to the transistor electrically connected to the light-emitting diode through the emission control line EL. FIG. 1 illustrates that the emission control driving circuit is arranged at one side of the display area DA. However, the emission control driving circuit may be arranged at both sides of the display area DA.

The data driving circuit 50 may be arranged in the peripheral area PA at a lower side of the display area DA. The data driving circuit 50 may be configured to transmit a data signal to the transistor electrically connected to the light-emitting diode through the data line DL.

A first pad portion TD1 may be arranged at a side of the substrate 100, for example, at an end of the peripheral area PA. A printed circuit board 60 may be coupled on (or to) the first pad portion TD1. The printed circuit board 60 may include a second pad portion TD2 electrically connected to the first pad portion TD1. A controller 70 may be arranged on the printed circuit board 60. Control signals of the controller 70 may be supplied to each of the first and second driving circuits 41 and 42, the data driving circuit 50, the driving voltage supply line 30, and the common voltage supply line 10 through the first and second pad portions TD1 and TD2.

Figure 2:
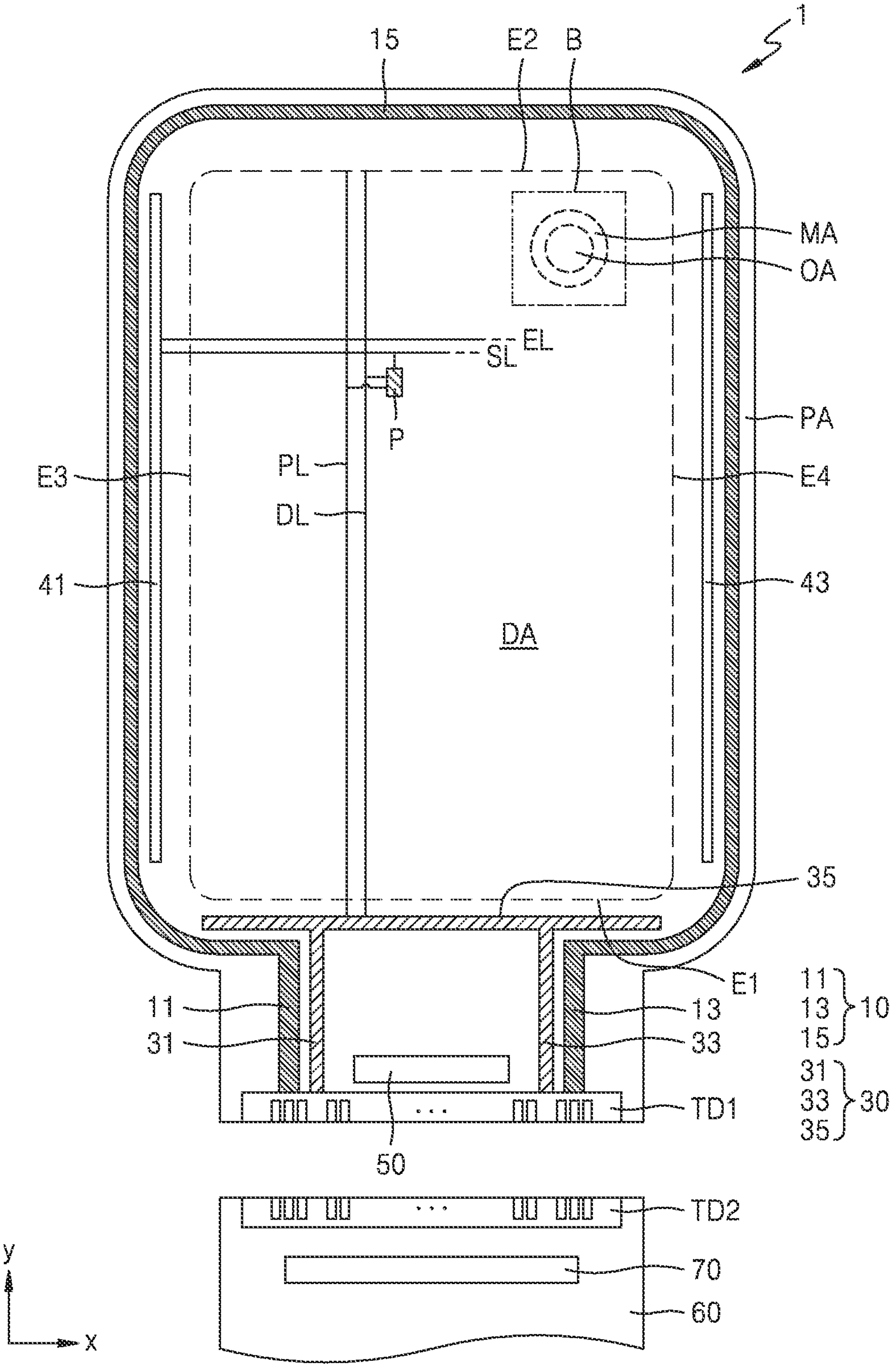
FIG. 2 is a schematic plan view of a portion of a display apparatus according to one or more embodiments of the present disclosure.

FIG. 2 is a schematic plan view of a portion of a display apparatus according to one or more embodiments of the present disclosure. The embodiments illustrated in FIG. 2 differ from the embodiments illustrated in FIG. 1 in that the display panel 1 may further include an opening area OA and a middle area MA, in addition to the display area DA and the peripheral area PA outside the display area DA. In FIG. 2, reference numerals that are the same as the reference numerals in FIG. 1 denote the same elements of FIG. 1, and thus, their descriptions are not repeated.

Referring to FIG. 2, the display panel 1 may include the display area DA and the peripheral area PA outside the display area DA. Also, the display panel 1 may further include the opening area OA and the middle area MA.

According to one or more embodiments, the display area DA may at least partially surround (or be around) the opening area OA. The middle area MA may be between the display area DA and the opening area OA. In a plan view, the middle area MA may be closed-loop shaped, completely surrounding (or around) the opening area OA.

The opening area OA may be at an inner side of the display area DA. According to one or more embodiments, the opening area OA may be arranged at an upper right side of the display area DA as illustrated in FIG. 2. In one or more embodiments, the opening area OA may be arranged at an upper left side or an upper middle side of the display area DA. Like this, the opening area OA may be arranged in various manners. FIG. 2 illustrates that one opening area OA is arranged. However, the present disclosure is not limited thereto. For example, a plurality of opening areas OA may be arranged.

Also, in one or more embodiments, a component may be arranged below the opening area OA. The component may include an electronic element. For example, the component may include an electronic element using light or sound. For example, the electronic element may include a sensor configured to use light, such as an infrared sensor, a camera configured to receive light and capture an image, a sensor configured to measure a distance or recognize a fingerprint, etc. by outputting and sensing light or sound, a small lamp configured to output light, a speaker configured to output sound, etc. The electronic element using light may use pieces of light of various wavelength ranges, such as visible rays, infrared rays, ultraviolet rays, etc. The opening area OA may correspond to an area through which light and/or sound output from the component to the outside or proceeding from the outside toward the electronic element is transmitted.

Figure 3:
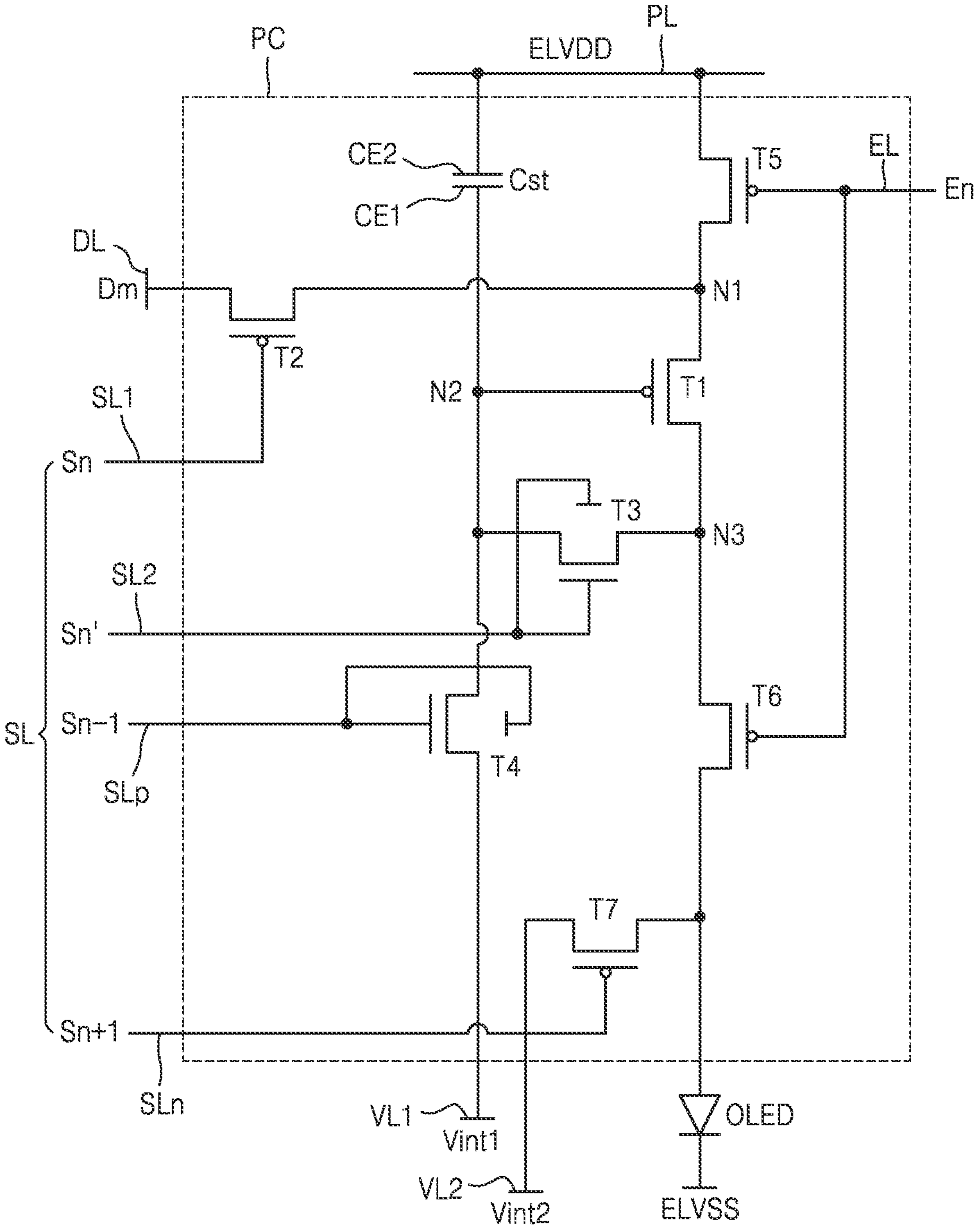
FIG. 3 is a schematic equivalent circuit diagram of a pixel circuit electrically connected to a light-emitting diode corresponding to a pixel of a display apparatus, according to one or more embodiments of the present disclosure.

FIG. 3 is a schematic equivalent circuit diagram of a pixel circuit PC electrically connected to a light-emitting diode corresponding to a pixel of a display apparatus according to one or more embodiments of the present disclosure.

The pixel circuit PC may include a plurality of thin-film transistors T1 through T7 and a storage capacitor Cst as illustrated in FIG. 3. The plurality of thin-film transistors T1 through T7 and the storage capacitor Cst may be connected to signal lines SL1, SL2, SLp, SLn, EL, and DL, a first initialization voltage line VL1, a second initialization voltage line VL2, and a driving voltage line PL. At least one of these lines described above, for example, the driving voltage line PL, may be shared by adjacent pixel circuits PC.

According to one or more embodiments, the plurality of thin-film transistors T1 through T7 may include a driving transistor T1, a switching transistor T2, a compensation transistor T3, a first initialization transistor T4, an operation control transistor T5, an emission control transistor T6, and a second initialization transistor T7. However, the present disclosure is not limited thereto.

An organic light-emitting diode OLED may include a pixel electrode and an opposite electrode. Through the emission control transistor T6, the pixel electrode of the organic light-emitting diode OLED may be connected to the driving transistor T1 and receive a driving current, and the opposite electrode of the organic light-emitting diode OLED may receive a common voltage ELVSS. The organic light-emitting diode OLED may generate the light having a brightness according to the driving current.

One or more of the plurality of thin-film transistors T1 through T7 may be provided as n-channel metal-oxide semiconductor field-effect transistors (MOSFETs) (NMOS), and the others may be provided as p-channel MOSFETs (PMOS). For example, the compensation transistor T3 and the first initialization transistor T4 from among the plurality of thin-film transistors T1 through T7 may be provided as NMOS transistors, and the others may be provided as PMOS transistors. In one or more embodiments, the compensation transistor T3, the first initialization transistor T4, and the second initialization transistor T7 from among the plurality of thin-film transistors T1 through T7 may be provided as NMOS transistors, and the others may be provided as PMOS transistors. In one or more embodiments, all of the plurality of thin-film transistors T1 through T7 may be provided as NMOS transistors or PMOS transistors. The plurality of thin-film transistors T1 through T7 may include amorphous silicon or polysilicon. The NMOS thin-film transistors may include oxide semiconductors. Hereinafter, for convenience, a case in which the compensation transistor T3 and the first initialization transistor T4 are NMOS transistors including oxide semiconductors, and the others are PMOS transistors is described.

The signal lines may include a first scan line SL1, a second scan line SL2, a previous scan line SLp, a next scan line SLn, an emission control line EL, and a data line DL. However, the present disclosure is not limited thereto. Also, the first scan line SL1 may be configured to transmit a first scan signal Sn. The second scan line SL2 may be configured to transmit a second scan signal Sn'. The previous scan line SLp may be configured to transmit a previous scan signal Sn−1 to the first initialization transistor T4. The next scan line SLn may be configured to transmit a next scan signal Sn+1 to the second initialization transistor T7. The emission control line EL may be configured to transmit an emission control signal En to the operation control transistor T5 and the emission control transistor T6. The data line DL may be configured to transmit a data signal Dm.

The driving voltage line PL may be configured to transmit a driving voltage ELVDD to the driving transistor T1, the first initialization voltage line VL1 may be configured to transmit a first initialization voltage Vint1 for initializing the driving transistor T1, and the second initialization voltage line VL2 may be configured to transmit a second initialization voltage Vint2 for initializing the pixel electrode of the organic light-emitting diode OLED.

A driving gate electrode of the driving transistor T1 may be connected to the storage capacitor Cst via a second node N2. Also, any one of a source area and a drain area of the driving transistor T1 may be connected to the driving voltage line PL through the emission control transistor T5 via a first node N1, and the other may be electrically connected to the pixel electrode of the organic light-emitting diode OLED through the emission control transistor T6 via a third node N3. The driving transistor T1 may be configured to receive the data signal Dm according to a switching operation of the switching transistor T2 and to supply the driving current to the organic light-emitting diode OLED. That is, according to a voltage applied to the second node N2, the voltage varying according to the data signal Dm, the driving transistor T1 may be configured to control the amount of currents flowing from the first node N1 electrically connected to the driving voltage line PL to the organic light-emitting diode OLED.

A switching gate electrode of the switching transistor T2 may be connected to the first scan line SL1 configured to transmit the first scan signal Sn. Either a source area or a drain area of the switching transistor T2 may be connected to the data line DL, and the other may be connected to the driving transistor T1 via the first node N1 and may be connected to the driving voltage line PL through the emission control transistor T5. The switching transistor T2 may be configured to transmit the data signal Dm from the data line DL to the first node N1, according to a voltage applied to the first scan line SL1. That is, the switching transistor T2 may be turned on in response to the first scan signal Sn received through the first scan line SL1 and may be configured to perform a switching operation of transmitting the data signal Dm transmitted through the data line DL to the driving transistor T1 via the first node N1.

A compensation gate electrode of the compensation transistor T3 may be connected to the second scan line SL2. A source area or a drain area of the compensation transistor T3 may be connected to the pixel electrode of the organic light-emitting diode OLED through the emission control transistor T6 via the third node N3. The other of the source area and the drain area of the compensation transistor T3 may be connected to a first capacitor electrode CE1 of the storage capacitor Cst and the driving gate electrode of the driving transistor T1 via the second node N2. The compensation transistor T3 may be turned on in response to the second scan signal Sn' received through the second scan line SL2 and may diode-connect the driving transistor T1.

A first initialization gate electrode of the first initialization transistor T4 may be connected to the previous scan line SLp. A source area or a drain area of the first initialization transistor T4 may be connected to the first initialization voltage line VL1. The other of the source area and the drain area of the first initialization transistor T4 may be connected to the first capacitor electrode CE1 of the storage capacitor Cst, the driving gate electrode of the driving transistor T1, etc. via the second node N2. The first initialization transistor T4 may be configured to apply the first initialization voltage Vint1 from the first initialization voltage line VL1 to the second node N2, according to a voltage applied to the previous scan line SLp. That is, the first initialization transistor T4 may be turned on in response to the previous scan signal Sn−1 received through the previous scan line SLp and may be configured to perform an initialization operation of initializing a voltage of the driving gate electrode of the driving transistor T1 by transmitting the initialization voltage Vint1 to the driving gate electrode of the driving transistor T1.

An operation control gate electrode of the operation control transistor T5 may be connected to the emission control line EL, and a source area or a drain area of the operation control transistor T5 may be connected to the driving voltage line PL and the other may be connected to the driving transistor T1 and the switching transistor T2 via the first node N1.

An emission control gate electrode of the emission control transistor T6 may be connected to the emission control line EL, and a source area or a drain area of the emission control transistor T6 may be connected to the driving transistor T1 and the compensation transistor T3 via the third node N3, and the other may be electrically connected to the pixel electrode of the organic light-emitting diode OLED.

The operation control transistor T5 and the emission control transistor T6 may be simultaneously turned on in response to the emission control signal En received through the emission control line EL so that the driving voltage ELVDD may be transmitted to the organic light-emitting diode OLED, and the driving current may flow in the organic light-emitting diode OLED.

A second initialization gate electrode of the second initialization transistor T7 may be connected to the next scan line SLn, and a source area or a drain area of the second initialization transistor T7 may be connected to the pixel electrode of the organic light-emitting diode OLED, and the other may be connected to the second initialization voltage line VL2 and may receive the second initialization voltage Vint2. The second initialization transistor T7 may be turned on in response to the next scan signal Sn+1 received through the next scan line SLn and may be configured to initialize the pixel electrode of the organic light-emitting diode OLED. The next scan line SLn may be the same as the first scan line SL1. In this case, by transmitting the same electrical signals to the corresponding scan line SL with a time interval between the electrical signals, the corresponding scan line may be configured to function as the first scan line SL1 and the next scan line SLn. That is, the next scan line SLn may be the first scan line SL1 of a different pixel circuit, which is adjacent to the pixel circuit PC illustrated in FIG. 3 and is connected to the same data line DL as the pixel circuit PC.

The storage capacitor Cst may include the first capacitor electrode CE1 and the second capacitor electrode CE2. The first capacitor electrode CE1 of the storage capacitor Cst may be connected to the driving gate electrode of the driving transistor T1 via the second node N2, and the second capacitor electrode CE2 of the storage capacitor Cst may be connected to the driving voltage line PL. The storage capacitor Cst may be configured to store a charge corresponding to a difference between a driving gate electrode voltage of the driving transistor T1 and the driving voltage ELVDD.

A detailed operation of the pixel circuit PC and the organic light-emitting diode OLED, according to one or more embodiments of the present disclosure, is described in more detail below.

During an initialization period, when the previous scan signal Sn−1 is supplied through the previous scan line SLp, the first initialization transistor T4 may be turned on in response to the previous scan signal Sn−1, and the driving transistor T1 may be initialized via the first initialization voltage Vint1 supplied from the first initialization voltage line VL1.

During a data programming period, when the first scan signal Sn and the second scan signal Sn' are supplied through the first scan line SL1 and the second scan line SL2, the switching transistor T2 and the compensation transistor T3 may be turned on in response to the first scan signal Sn and the second scan signal Sn'. Here, the driving transistor T1 may be diode-connected by the compensation transistor T3 that is turned on and may be biased in a forward direction. Then, a compensation voltage Dm+Vth (Vth has a negative (−) value) obtained by subtracting a threshold voltage Vth of the driving transistor T1 from the data signal Dm supplied from the data line DL may be applied to the driving gate electrode of the driving transistor T1. The driving voltage ELVDD and the compensation voltage Dm+Vth may be applied to both ends of the storage capacitor Cst, and a charge corresponding to a difference between the voltages of both ends of the storage capacitor Cst may be stored in the storage capacitor Cst.

During an emission period, the operation control transistor T5 and the emission control transistor T6 may be turned on in response to the emission control signal En supplied from the emission control line EL. A driving current according to a voltage difference between a voltage of the driving gate electrode of the driving transistor T1 and the driving voltage ELVDD may occur, and the driving current may be supplied to the organic light-emitting diode OLED through the emission control transistor T6.

As described above, one or more of the plurality of thin-film transistors T1 through T7 may include oxide semiconductors. For example, the compensation transistor T3 and the first initialization transistor T4 may include oxide semiconductors. However, the present disclosure is not limited thereto.

Polysilicon is highly reliable, and thus, the flow of currents for which precision is desired may include polysilicon. Thus, the driving transistor T1 directly affecting brightness of a display apparatus may include a semiconductor layer including polysilicon that is highly reliable, to realize a display apparatus having high resolution. An oxide semiconductor may have a high carrier mobility and a low leakage current, and thus, even when a driving time is increased, a voltage drop may be insignificant. That is, in the case of an oxide semiconductor, even during low frequency driving, a color change of an image due to a voltage drop may be insignificant. Accordingly, low frequency driving may be possible. Thus, the compensation transistor T3 and the first initialization transistor T4 may include the oxide semiconductor, to realize a display apparatus in which leakage currents are prevented (or substantially prevented) and power consumption is reduced.

However, the oxide semiconductor is sensitive to light, and thus, the amount of currents may be changed, etc., due to external light. Thus, a metal layer may be arranged below the oxide semiconductor to absorb or reflect the light from the outside. Accordingly, as illustrated in FIG. 3, a gate electrode may be arranged both above and below an oxide semiconductor layer of each of the compensation transistor T3 and the first initialization transistor T4 that include the oxide semiconductor. That is, from a direction (for example, a z axis direction) perpendicular to an upper surface of the substrate 100, a metal layer arranged below the oxide semiconductor may overlap the oxide semiconductor.

Figure 4:
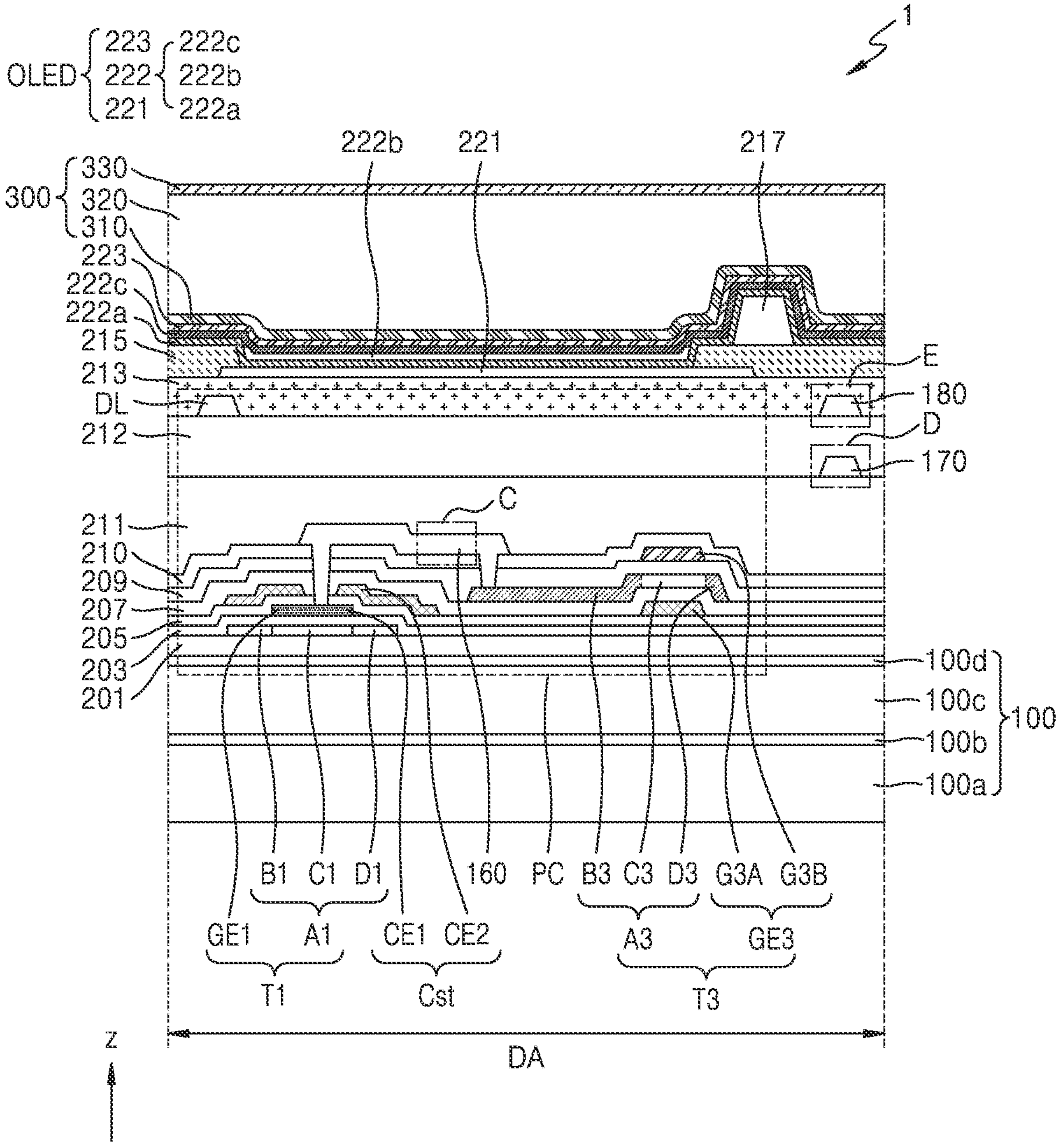
FIG. 4 is a schematic cross-sectional view of a light-emitting diode of a display apparatus and a pixel circuit electrically connected to the light-emitting diode, according to one or more embodiments of the present disclosure.

FIG. 4 is a schematic cross-sectional view of a light-emitting diode of a display apparatus and a pixel circuit PC electrically connected to the light-emitting diode, according to one or more embodiments of the present disclosure.

Referring to FIG. 4, an organic light-emitting diode OLED may be arranged in the display area DA, wherein the organic light-emitting diode OLED may be electrically connected to the pixel circuit PC arranged between the substrate 100 and the organic light-emitting diode OLED in a direction (for example, a z axis direction) that is perpendicular to the substrate 100.

The substrate 100 may include glass materials or polymer resins. According to one or more embodiments, the substrate 100 may have a stack structure in which a base layer including polymer resins and a barrier layer including an organic insulating material, such as silicon oxide or silicon nitride, are alternately stacked. For example, the substrate 100 may include a first base layer 100*a*, a first barrier layer 100*b*, a second base layer 100*c*, and a second barrier layer 100*d* that are sequentially stacked. The first base layer 100*a* and the second base layer 100*c* may include polymer resins, and the first barrier layer 100*b* and the second barrier layer 100*d* may include an inorganic insulating material. The polymer resins may include polyether sulfone, polyarylate, polyether imide, polyethylene naphthalate, polyethylene terephthalate, polyphenylene sulfide, polyimide, polycarbonate, cellulose triacetate, and/or cellulose acetate propionate.

A buffer layer 201 may be arranged on the substrate 100. The buffer layer 201 may reduce or prevent the penetration of impurities, moisture, and/or external substances from below the substrate 100. The buffer layer 201 may include an inorganic material, such as silicon oxide ($SiO_x$), silicon oxynitride (SiON), and/or silicon nitride ($SiN_x$), and may include a single layer or multiple layers including the inorganic material(s) described above.

As described above with reference to FIG. 3, the pixel circuit PC may include a plurality of transistors and a storage capacitor. With respect to this configuration, FIG. 4 illustrates the driving transistor T1, the compensation transistor T3, and the storage capacitor Cst.

The driving transistor T1 may include a semiconductor layer (hereinafter, referred to as a driving semiconductor layer A1) on the buffer layer 201 and a driving gate electrode GE1 overlapping a channel area C1 of the driving semiconductor layer A1. The driving semiconductor layer A1 may include a silicon-based semiconductor material, for example, polysilicon. The driving semiconductor layer A1 may include the channel area C1 and a first area B1 and a second area D1 arranged at opposing sides of the channel area C1, respectively. The first area B1 and the second area D1 may include more highly concentrated impurities than the channel area C1, and one of the first area B1 and the second area D1 may correspond to a source area, and the other may correspond to a drain area.

A first gate insulating layer 203 may be arranged between the driving semiconductor layer A1 and the driving gate electrode GE1. The first gate insulating layer 203 may include an inorganic insulating material, such as $SiO_x$, $SiN_x$, and/or SiON, and may include a single layer or multiple layers including the inorganic insulating material(s) described above.

The driving gate electrode GE1 may include a conductive material including Mo, Al, Cu, Ti, and/or other suitable material(s), and may include a single layer or multiple layers including the conductive material(s) described above.

The storage capacitor Cst may include the first capacitor electrode CE1 and the second capacitor electrode CE2 overlapping each other. According to one or more embodiments, the first capacitor electrode CE1 of the storage capacitor Cst may include the driving gate electrode GE1. In other words, the driving gate electrode GE1 may include the first capacitor electrode CE1 of the storage capacitor Cst. For example, the driving gate electrode GE1 and the first capacitor electrode CE1 may be integrally formed.

A first interlayer insulating layer 205 may be arranged between the first capacitor electrode CE1 and the second capacitor electrode CE2 of the storage capacitor Cst. The first interlayer insulating layer 205 may include an inorganic insulating material, such as $SiO_x$, $SiN_x$, and/or SiON, and may include a single layer or multiple layers including the inorganic insulating material(s) described above.

The second capacitor electrode CE2 of the storage capacitor Cst may include a low resistance conductive material, such as Mo, Al, Cu, and/or Ti, and may include a single layer or multiple layers including the material(s) described above.

A second interlayer insulating layer 207 may be arranged on the storage capacitor Cst. The second interlayer insulating layer 207 may include an inorganic insulating material, such as $SiO_x$, $SiN_x$, and/or SiON, and may include a single layer or multiple layers including the inorganic insulating material(s) described above.

A semiconductor layer (hereinafter, referred to as a compensation semiconductor layer A3) of the compensation transistor T3 may be arranged on the second interlayer insulating layer 207. The compensation semiconductor layer A3 may include an oxide-based semiconductor material. For example, the compensation semiconductor layer A3 may include a Zn oxide-based material, for example, a Zn oxide, an In—Zn oxide, a Ga—In—Zn oxide, and/or other suitable material(s). In one or more embodiments, the compensation semiconductor layer A3 may include a semiconductor including In—Ga—Zn—O (IGZO), In—Sn—Zn—O (ITZO), and/or In—Ga—Sn—Zn—O (IGTZO), in which a metal, such as In, Ga, or Sn, is included in ZnO.

The compensation semiconductor layer A3 may include a channel area C3, and a third area B3 and a fourth area D3 arranged at respective sides of the channel area C3. One of the third area B3 and the fourth area D3 may correspond to a source area, and the other may correspond to a drain area.

The compensation transistor T3 may include a compensation gate electrode GE3 overlapping the channel area C3 of the compensation semiconductor layer A3. The compensation gate electrode GE3 may have a dual gate structure including a lower gate electrode G3A arranged below the compensation semiconductor layer A3 and an upper gate electrode G3B arranged above the channel area C3.

The lower gate electrode G3A may be arranged on the same layer (for example, the first interlayer insulating layer 205) as the second capacitor electrode CE2 of the storage capacitor Cst. The lower gate electrode G3A may include the same material as the second capacitor electrode CE2 of the storage capacitor Cst.

The upper gate electrode G3B may be arranged on the compensation semiconductor layer A3 with a second gate insulating layer 209 therebetween. The second gate insulating layer 209 may include an inorganic insulating material, such as $SiO_x$, $SiN_x$, and/or SiON, and may include a single layer or multiple layers including the inorganic insulating material(s) described above.

A third interlayer insulating layer 210 may be arranged on the upper gate electrode G3B. The third interlayer insulating layer 210 may include an inorganic insulating material, such as $SiO_x$, $SiN_x$, and/or SiON, and may include a single layer or multiple layers including the inorganic insulating material(s) described above.

The driving transistor T1 and the compensation transistor T3 may be electrically connected to each other through a first connection pattern 160. The first connection pattern 160 may be arranged on the third interlayer insulating layer 210. A side of the first connection pattern 160 may be connected to the driving gate electrode GE1 of the driving transistor T1, and the other side of the first connection pattern 160 may be connected to the compensation semiconductor layer A3 of the compensation transistor T3. However, the present disclosure is not limited thereto. The first connection pattern 160 may denote a line or a conductive layer arranged on the third interlayer insulating layer 210.

The first connection pattern 160 may include Al, Cu, and/or Ti and may include a single layer or multiple layers including the material(s) described above. For example, the first connection pattern 160 may have a triple-layered structure of a Ti layer/an Al layer/a Ti layer. This aspect is described in more detail with reference to FIG. 5A.

A first organic insulating layer 211 may be arranged on the first connection pattern 160. The first organic insulating layer 211 may include an organic insulating material. The organic insulating material may include acryl, benzocyclobutene (BCB), polyimide, and/or hexamethyldisiloxane (HMDSO).

A second connection pattern 170 may be arranged on the first organic insulating layer 211. The second connection pattern 170 may include Al, Cu, and/or Ti and may include a single layer or multiple layers including the material(s) described above. For example, the second connection pattern 170 may have a triple-layered structure of a Ti layer/an Al layer/a Ti layer. This aspect is to be described in more detail with reference to FIG. 5B.

A second organic insulating layer 212 may be arranged on the second connection pattern 170. The second organic insulating layer 212 may include an organic insulating material, such as acryl, BCB, polyimide, and/or HMDSO.

A third connection pattern 180 and a data line DL may be arranged on the second organic insulating layer 212. However, the present disclosure is not limited thereto. The data line DL may be arranged on the third interlayer insulating layer 210 or the first organic insulating layer 211. The third connection pattern 180 and the data line DL may include Al, Cu, and/or Ti and may include a single layer or multiple layers including the material(s) described above. For example, the third connection pattern 180 and the data line DL may have a triple-layered structure of a Ti layer/an Al layer/a Ti layer. This aspect is described in more detail with reference to FIG. 5C.

A third organic insulating layer 213 may be arranged on the third connection pattern 180 and the data line DL. The third organic insulating layer 213 may include an organic insulating material, such as acryl, BCB, polyimide, and/or HMDSO.

FIG. 4 illustrates the first organic insulating layer 211, the second organic insulating layer 212, and the third organic insulating layer 213. However, the present disclosure is not limited thereto. For example, at least one of the first through third organic insulating layers 211 through 213 may be omitted.

The organic light-emitting diode OLED may be arranged on the third organic insulating layer 213. The organic light-emitting diode OLED may include a pixel electrode 221, an intermediate layer 222, and an opposite electrode 223.

The pixel electrode 221 may be arranged on the third organic insulating layer 213. The pixel electrode 221 may include a reflective layer including Ag, Mg, Al, Pt, Pd, Au, Ni, Nd, Ir, Cr, and/or a compound thereof. In one or more embodiments, the pixel electrode 221 may further include a conductive oxide layer above and/or below the reflective layer described above. The conductive oxide layer may include indium tin oxide (ITO), indium zinc oxide (IZO), zinc oxide (ZnO), indium oxide ($In_2O_3$), indium gallium oxide (IGO), and/or aluminum zinc oxide (AZO). According to one or more embodiments, the pixel electrode 221 may have a tripled-layered structure of ITO/Ag/ITO layers.

A pixel-defining layer 215 may be arranged on the pixel electrode 221. An opening may be defined in the pixel-defining layer 215 to expose at least a portion of the pixel electrode 221. A central portion of the pixel electrode 221 may be exposed by the opening defined in the pixel-defining layer 215.

The pixel-defining layer 215 may include an organic insulating material. In one or more embodiments, the pixel-defining layer 215 may include an inorganic insulating material, such as $SiN_x$, SiON, and/or $SiO_x$. In one or more embodiments, the pixel-defining layer 215 may include an organic insulating material and an inorganic insulating material. In one or more embodiments, the pixel-defining layer 215 may include a light-shielding material and may be provided as a black color. The light-shielding material may include a resin or paste including carbon black, a carbon nano-tube, and/or a black dye, a metal particle, such as Ni, Al, Mo, and/or an alloy thereof, a metal oxide particle (for example, chromium oxide), a metal nitride particle (for example, chromium nitride), and/or other suitable particle(s). When the pixel-defining layer 215 includes a light-shielding material, reflection of external light due to metal structures arranged below the pixel-defining layer 215 may be reduced.

A spacer 217 may be arranged on the pixel-defining layer 215. The spacer 217 may include an organic insulating material, such as polyimide. In one or more embodiments, the spacer 217 may include an inorganic insulating material, such as $SiO_x$, $SiN_x$, and/or SiON, or an organic insulating material and an inorganic insulating material.

According to one or more embodiments, the spacer 217 may include the same material as the pixel-defining layer 215. In this case, the pixel-defining layer 215 and the spacer 217 may be formed together by a mask process using a half-tone mask, and/or other suitable process. According to one or more embodiments, the spacer 217 and the pixel-defining layer 215 may include different materials from each other.

The intermediate layer 222 may be arranged on the pixel electrode 221. The intermediate layer 222 may include a first functional layer 222*a*, an emission layer 222*b*, and a second functional layer 222*c* that are sequentially stacked. The first functional layer 222*a* and the second functional layer 222*c* may be commonly referred to as a functional layer.

The emission layer 222*b* may be arranged in the opening defined in the pixel-defining layer 215. The emission layer 222*b* may include a high molecular-weight organic material or a low molecular-weight organic material emitting a light of a desired or specified color.

The first functional layer 222*a* may be arranged between the pixel electrode 221 and the emission layer 222*b*, and the second functional layer 222*c* may be arranged between the emission layer 222*b* and the opposite electrode 223. However, the present disclosure is not limited thereto. At least one of the first functional layer 222*a* and/or the second functional layer 222*c* may be omitted.

The first functional layer 222*a* may include, for example, a hole transport layer (HTL), or an HTL and a hole injection layer (HIL). The second functional layer 222*c* may include an electron transport layer (ETL) and/or an electron injection layer (EIL). The first functional layer 222*a* and/or the second functional layer 222*c* may be a common layer formed to entirely cover the substrate 100.

The opposite electrode 223 may include a conductive material having a low work function. For example, the opposite electrode 223 may include a transparent (or transflective) layer including Ag, Mg, Al, Pt, Pd, Au, Ni, Nd, Ir, Cr, Li, Ca, and/or an alloy thereof. In one or more embodiments, the opposite electrode 223 may further include a layer, such as an ITO, IZO, ZnO, and/or $In_2O_3$ layer, on the transparent (or transflective) layer including the material(s) described above.

The organic light-emitting diode 220 may be covered by an encapsulation layer 300. The encapsulation layer 300 may include at least one organic encapsulation layer and at least one inorganic encapsulation layer. According to one or more embodiments, the encapsulation layer 300 may include a first inorganic encapsulation layer 310, a second inorganic encapsulation layer 330, and an organic encapsulation layer 320. The organic encapsulation layer 320 may be arranged between the first inorganic encapsulation layer 310 and the second inorganic encapsulation layer 330.

The first and second inorganic encapsulation layers 310 and 330 may include one or more inorganic materials from among aluminum oxide ($Al_2O_3$), titanium oxide (TiO), tantalum oxide ($TA_2O_5$), hafnium oxide ($HfO_2$), ZnO, $SiO_x$, $SiN_x$, and/or SiON. The first and second inorganic encapsulation layers 310 and 330 may include a single layer or multiple layers including the material(s) described above. The organic encapsulation layer 320 may include a polymer-based material. The polymer-based material may include acryl-based resins, epoxy-based resins, polyimide, polyethylene, and/or other suitable materials. According to one or more embodiments, the organic encapsulation layer 320 may include acrylate.

Figure 5A:
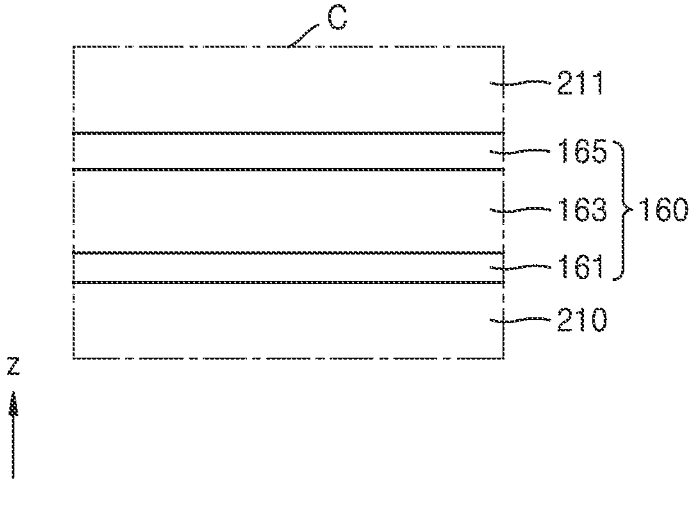
FIGS. 5A, 5B, and 5C are schematic cross-sectional views of regions C, D, and E, respectively, of the display apparatus of FIG. 4, according to one or more embodiments of the present disclosure.
Figure 5B:
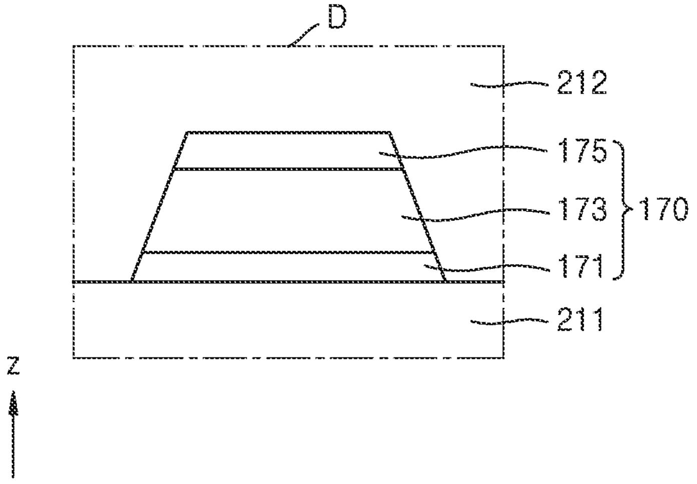
Figure 5C:
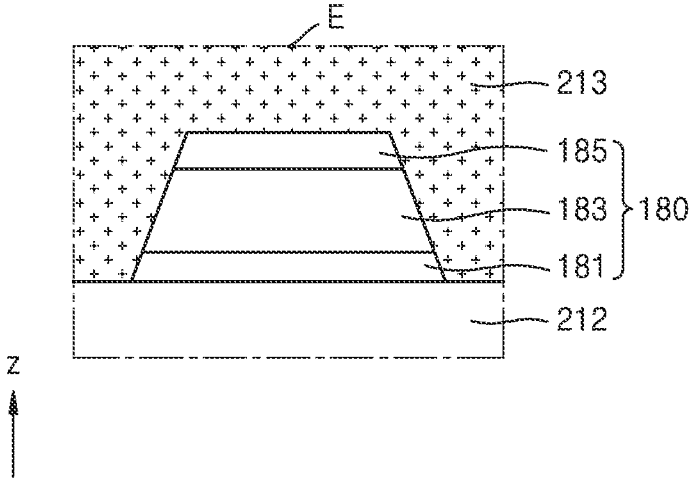

FIGS. 5A, 5B, and 5C are schematic cross-sectional views of portions of a display apparatus according to one or more embodiments of the present disclosure. In detail, FIGS. 5A, 5B, and 5C correspond to enlargements of region C, region D, and region E of FIG. 4, respectively. In FIGS. 5A through 5C, reference numerals that are the same as the reference numerals in FIG. 4 denote the same elements of FIG. 4, and thus, their descriptions are not repeated.

Referring to FIG. 5A, the first connection pattern 160 may be arranged on the third interlayer insulating layer 210. The first connection pattern 160 may include a first layer 161, a second layer 163, and a third layer 165 that are sequentially stacked. Each of the first through third layers 161 through 165 may include at least one of Al, Cu, and/or Ti. For example, the first layer 161 and the third layer 165 may include Ti, and the second layer 163 may include Al. However, the present disclosure is not limited thereto.

Referring to FIG. 5B, the second connection pattern 170 may be arranged on the first organic insulating layer 211. The second connection pattern 170 may include a fourth layer 171, a fifth layer 173, and a sixth layer 175 that are sequentially stacked. Each of the fourth through sixth layers 171 through 175 may include at least one of Al, Cu, and/or Ti. For example, the fourth layer 171 and the sixth layer 175 may include Ti, and the fifth layer 173 may include Al. However, the present disclosure is not limited thereto.

Referring to FIG. 5C, the third connection pattern 180 may be arranged on the second organic insulating layer 212. The third connection pattern 180 may include a seventh layer 181, an eighth layer 183, and a ninth layer 185 that are sequentially stacked. Each of the seventh through ninth layers 181 through 185 may include at least one of Al, Cu, and/or Ti. For example, the seventh layer 181 and the ninth layer 185 may include Ti, and the eighth layer 183 may include Al. However, the present disclosure is not limited thereto.

Figure 6:
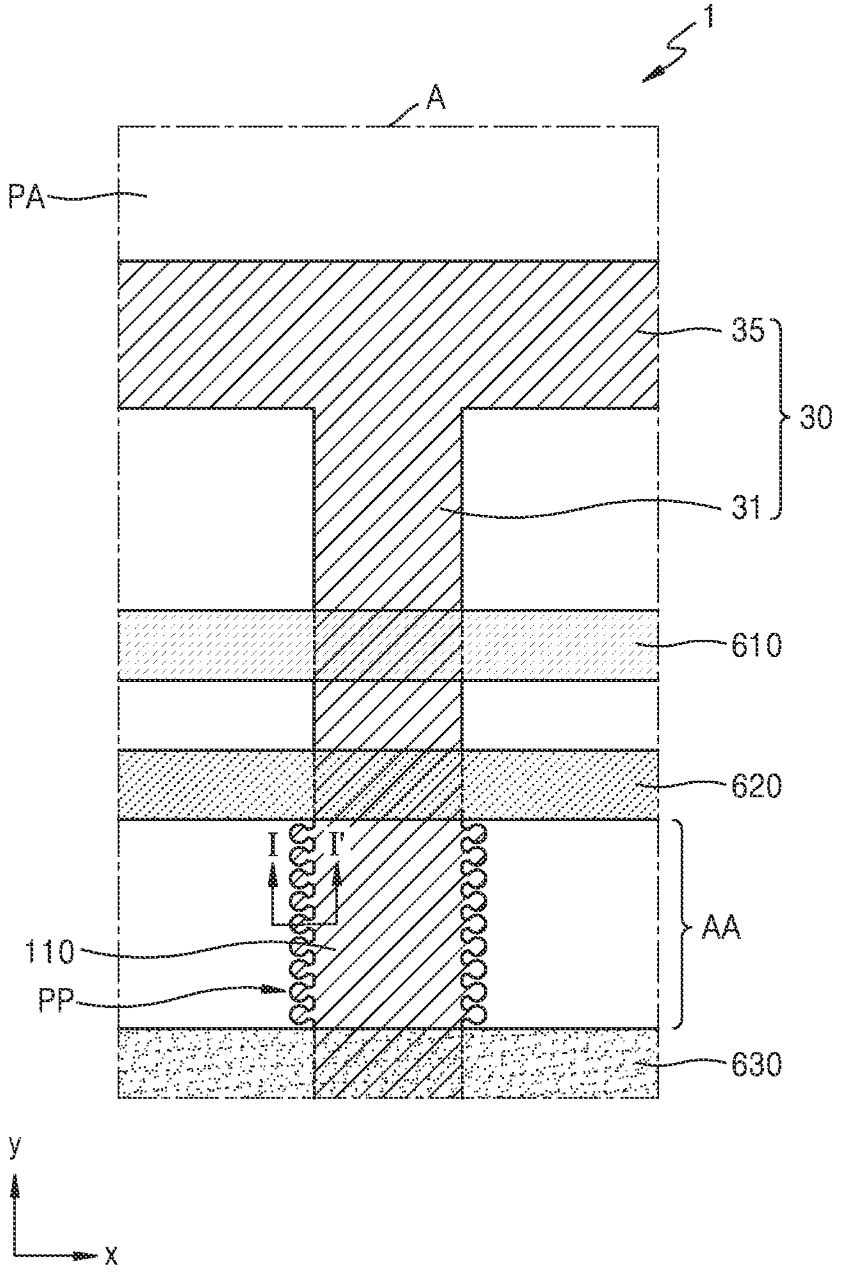
FIG. 6 is a schematic plan view of region A of the display apparatus of FIG. 1, according to one or more embodiments of the present disclosure.

FIG. 6 is a schematic plan view of a portion of a display apparatus according to one or more embodiments of the present disclosure. In detail, FIG. 6 corresponds to an enlargement of region A of FIG. 1. In FIG. 6, reference numerals that are the same as the reference numerals in FIG. 1 denote the same elements of FIG. 1, and thus, their descriptions are not repeated.

Referring to FIG. 6, the driving voltage supply line 30 may be arranged in the peripheral area PA of the display panel 1. Also, a first dam portion 610, a second dam portion 620, and a bank 630 may be arranged in the peripheral area PA of the display panel 1.

As described above with reference to FIG. 1, the driving voltage supply line 30 may include the first driving voltage supply line 31, the second driving voltage supply line 33 (see, e.g., FIG. 1), and the third driving voltage supply line 35.

When forming the encapsulation layer 300 (see, e.g., FIG. 4), in detail, the organic encapsulation layer 320 (see, e.g., FIG. 4), it is required to apply a material for forming an organic encapsulation layer within a suitable area (e.g., a predetermined area). To this end, as illustrated in FIG. 6, the first dam portion 610 may be arranged in the peripheral area PA. The first dam portion 610 may be arranged to surround (or be around) the display area DA (see, e.g., FIG. 1). That is, the first dam portion 610 may be arranged along a circumference of the display area DA.

The second dam portion 620 may further be arranged outside the first dam portion 610. The second dam portion 620 may be arranged to surround (or be around) the first dam portion 610. That is, the second dam portion 620 may be arranged along a circumference of the first dam portion 610. Also, because the first dam portion 610 may be arranged along the circumference of the display area DA, it may be understood that the second dam portion 620 may also be arranged along the circumference of the display area DA.

Because the first dam portion 610 and/or the second dam portion 620 may be arranged along the circumference of the display area DA, the material for forming an organic encapsulation layer may be prevented (or substantially prevented) from being diffused toward an edge of the substrate 100 (see, e.g., FIG. 4), a location for forming the organic encapsulation layer 320 may be defined, and formation of an edge tail of the organic encapsulation layer 320 may be prevented (or substantially prevented).

The bank 630 may further be arranged outside the second dam portion 620. The bank 630 may at least partially surround (or be around) the second dam portion 620. The bank 630 may support masks which are used in a manufacturing process of the display panel 1 to form the intermediate layer 222 (see, e.g., FIG. 4) and/or the opposite electrode 223 (see, e.g., FIG. 4) of the organic light-emitting diode OLED (see, e.g., FIG. 4), and by doing so, may prevent or minimize damage to previously formed components, the damage being caused by the masks.

According to one or more embodiments, an end of the organic encapsulation layer 320 may be arranged between the display area DA and the first dam portion 610. In one or more embodiments, an end of the organic encapsulation layer 320 may be arranged on the first dam portion 610.

According to one or more embodiments, the first inorganic encapsulation layer 310 (see, e.g., FIG. 7) and the second inorganic encapsulation layer 330 (see, e.g., FIG. 7) of the encapsulation layer 300 may extend toward the bank 630. Ends of the first inorganic encapsulation layer 310 and the second inorganic encapsulation layer 330 may be arranged between the second dam portion 620 and the bank 630. In one or more embodiments, ends of the first inorganic encapsulation layer 310 and the second inorganic encapsulation layer 330 may be arranged on the bank 630.

According to one or more embodiments, the peripheral area PA may include an adhesion area AA. The adhesion area AA may be arranged between the second dam portion 620 and the bank 630. For example, the adhesion area AA including only inorganic insulating materials may be defined between the second dam portion 620 and the bank 630. Here, that the adhesion area AA includes only inorganic insulating materials may denote that an organic insulating material may not be arranged in the adhesion area AA. That is, an inorganic insulating layer and/or a conductive pattern may be arranged in the adhesion area AA. In the adhesion area AA, the first inorganic encapsulation layer 310 may directly contact the second inorganic encapsulation layer 330 and another inorganic layer may be below the first inorganic encapsulation layer 310, for example, the third interlayer insulating layer 210 (see, e.g., FIG. 7), and thus, an adhesive force of the encapsulation layer 300 may be improved to relatively more effectively prevent or minimize the penetration of external moisture and oxygen.

According to one or more embodiments, a conductive pattern 110 may be arranged in the adhesion area AA. Here, the conductive pattern 110 may a portion of the first driving voltage supply line 31. For example, at least a portion of the first driving voltage supply line 31 may overlap the adhesion area AA, and the portion of the first driving voltage supply line 31, the portion overlapping the adhesion area AA, may correspond to the conductive pattern 110.

According to one or more embodiments, the conductive pattern 110 may extend in a first direction (for example, a y direction). Also, the conductive pattern 110 may include protrusion patterns PP protruding in a second direction (for example, an x direction) crossing the first direction (for example, the y direction). That is, the portion of the first driving voltage supply line 31, the portion overlapping the adhesion area AA, may include the protrusion patterns PP protruding in the second direction (for example, the x direction). The protrusion patterns PP may be formed at an edge of the conductive pattern 110 (for example, the first driving voltage supply line 31) and may outwardly protrude on an x-y plane.

The edge of the conductive pattern 110 (for example, the first driving voltage supply line 31) may be a movement path of external moisture and oxygen. When a length of the edge of the conductive pattern 110 (for example, the first driving voltage supply line 31) increases, the movement path of external moisture and oxygen may increase. Accordingly, the organic light-emitting diode OLED (FIG. 4) arranged in the display area DA may be protected (or substantially protected) from external moisture and oxygen.

According to one or more embodiments, because the protrusion patterns PP may be provided at the edge of the conductive pattern 110 (for example, the first driving voltage supply line 31), the length of the edge of the conductive pattern 110 (for example, the first driving voltage supply line 31) may be increased. Thus, transmission of external moisture and oxygen to the display area DA may be prevented or minimized, and as a result, damage to (or contamination of) the organic light-emitting diode OLED may be prevented or minimized.

Figure 7:
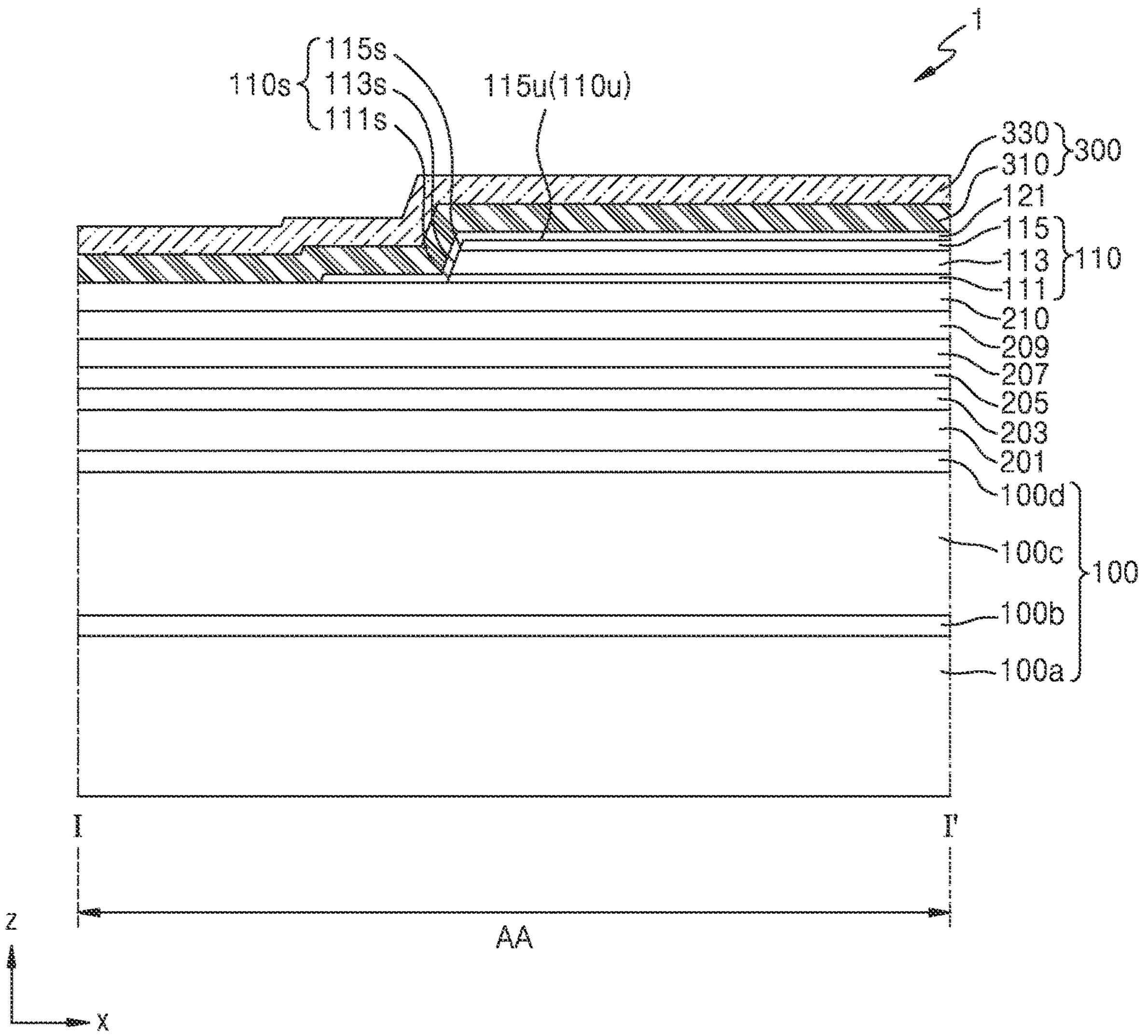
FIG. 7 is a schematic cross-sectional view of a portion of a display apparatus taken along the line I-I' of FIG. 6, according to one or more embodiments of the present disclosure.

FIG. 7 is a schematic cross-sectional view of a portion of a display apparatus according to one or more embodiments. In detail, FIG. 7 is a cross-sectional view of the display apparatus of FIG. 6, taken along the line I-I'. In FIG. 7, reference numerals that are the same as the reference numerals in FIGS. 4 and 6 denote the same elements of FIGS. 4 and 6, and thus, their descriptions are not repeated.

Referring to FIG. 7, the substrate 100 may be arranged in the adhesion area AA. As described above, the substrate 100 may include the first base layer 100*a*, the first barrier layer 100*b*, the second base layer 100*c*, and the second barrier layer 100*d*.

The buffer layer 201, the first gate insulating layer 203, the first interlayer insulating layer 205, the second interlayer insulating layer 207, the second gate insulating layer 209, and the third interlayer insulating layer 210 may be sequentially arranged on the substrate 100. All of the buffer layer 201, the first gate insulating layer 203, the first interlayer insulating layer 205, the second interlayer insulating layer 207, the second gate insulating layer 209, and the third interlayer insulating layer 210 may include inorganic insulating materials.

The conductive pattern 110 may be arranged on the third interlayer insulating layer 210. As described above, the conductive pattern 110 may be a portion of the first driving voltage supply line 31. The conductive pattern 110 may include a first conductive layer 111, a second conductive layer 113, and a third conductive layer 115 that are sequentially stacked. Each of the first through third conductive layers 111 through 115 may include at least one of Al, Cu, and/or Ti. For example, the first conductive layer 111 and the third conductive layer 115 may include Ti, and the second conductive layer 113 may include Al. However, the present disclosure is not limited thereto.

According to one or more embodiments, the conductive pattern 110 may be arranged on (or at) the same layer as at least one of the first connection pattern 160 (see, e.g., FIG. 5A), the second connection pattern 170 (see, e.g., FIG. 5B), and/or the third connection pattern 180 (see, e.g., FIG. 5C) described above with reference to FIGS. 5A through 5C. For example, the conductive pattern 110 may be arranged on (or at) the same layer as the first connection pattern 160. The first through third conductive layers 111 through 115 of the conductive pattern 110 may be arranged on (or at) the same layer by including the same material as the first layer 161, the second layer 163, and the third layer 165 of the first connection pattern 160, respectively.

According to one or more embodiments, a cover layer 121 may be arranged on the conductive pattern 110. The cover layer 121 may include at least one of Al, Cu, and/or Ti. For example, the cover layer 121 may include Ti. The cover layer 121 may include the same material as the first conductive layer 111 or the third conductive layer 115 of the conductive pattern 110. In one or more embodiments, the cover layer 121 may include the same material as the fourth layer 171 of the second connection pattern 170 described above with reference to FIG. 5B.

According to one or more embodiments, the cover layer 121 may cover a side surface 110*s* of the conductive pattern 10 and at least a portion of an upper surface 110*u* of the conductive pattern 110. In detail, the cover layer 121 may cover a side surface 111*s* of the first conductive layer 111, a side surface 113*s* of the second conductive layer 113, a side surface 115*s* of the third conductive layer 115, and at least a portion of an upper surface 115*u* of the third conductive layer 115.

When, in a process of manufacturing the display apparatus, the side surface 113*s* of the second conductive layer 113 is exposed, an undercut may occur in the side surface 113*s* of the second conductive layer 113, which may generate an opening, and the opening may become a movement path of external moisture and oxygen.

The cover layer 121 may cover the side surface 111*s* of the first conductive layer 111, the side surface 113*s* of the second conductive layer 113, the side surface 115*s* of the third conductive layer 115, and at least the portion of the upper surface 115*u* of the third conductive layer 115, and thus, occurrence of an undercut in the side surface 113*s* of the second conductive layer 113 due to exposure may be prevented or minimized. Thus, damage to (or contamination of) the organic light-emitting diode OLED (FIG. 4) arranged in the display area DA, caused by external moisture and oxygen, may be prevented or minimized.

According to one or more embodiments, the encapsulation layer 300 may be arranged on the cover layer 121 and the third interlayer insulating layer 210. In detail, the first inorganic encapsulation layer 310 may be arranged on the cover layer 121 and the third interlayer insulating layer 210. The first inorganic encapsulation layer 310 may be directly arranged on the cover layer 121 and the third interlayer insulating layer 210.

According to one or more embodiments, the second inorganic encapsulation layer 330 may be arranged on the first inorganic encapsulation layer 310. The second inorganic encapsulation layer 330 may be directly arranged on the first inorganic encapsulation layer 310. The first inorganic encapsulation layer 310 may be directly arranged on the cover layer 121 and the third interlayer insulating layer 210, and the second inorganic encapsulation layer 330 may be directly arranged on the first inorganic encapsulation layer 310, and thus, an adhesive force of the encapsulation layer 300 may be increased, and thus, the penetration of external moisture and oxygen may be relatively more effectively prevented or minimized.

The first driving voltage supply line 31 is described with reference to FIGS. 6 and 7. However, the second driving voltage supply line 33, the first common voltage supply line 11, and the second common voltage supply line 13 may have the same or substantially the same structure. For example, the protrusion patterns PP may be included in each of the second driving voltage supply line 33, the first common voltage supply line 11, and the second common voltage supply line 13 overlapping the adhesion area AA, and the cover layer 121 may be included in each of the second driving voltage supply line 33, the first common voltage supply line 11, and the second common voltage supply line 13 overlapping the adhesion area AA.

Figure 8:
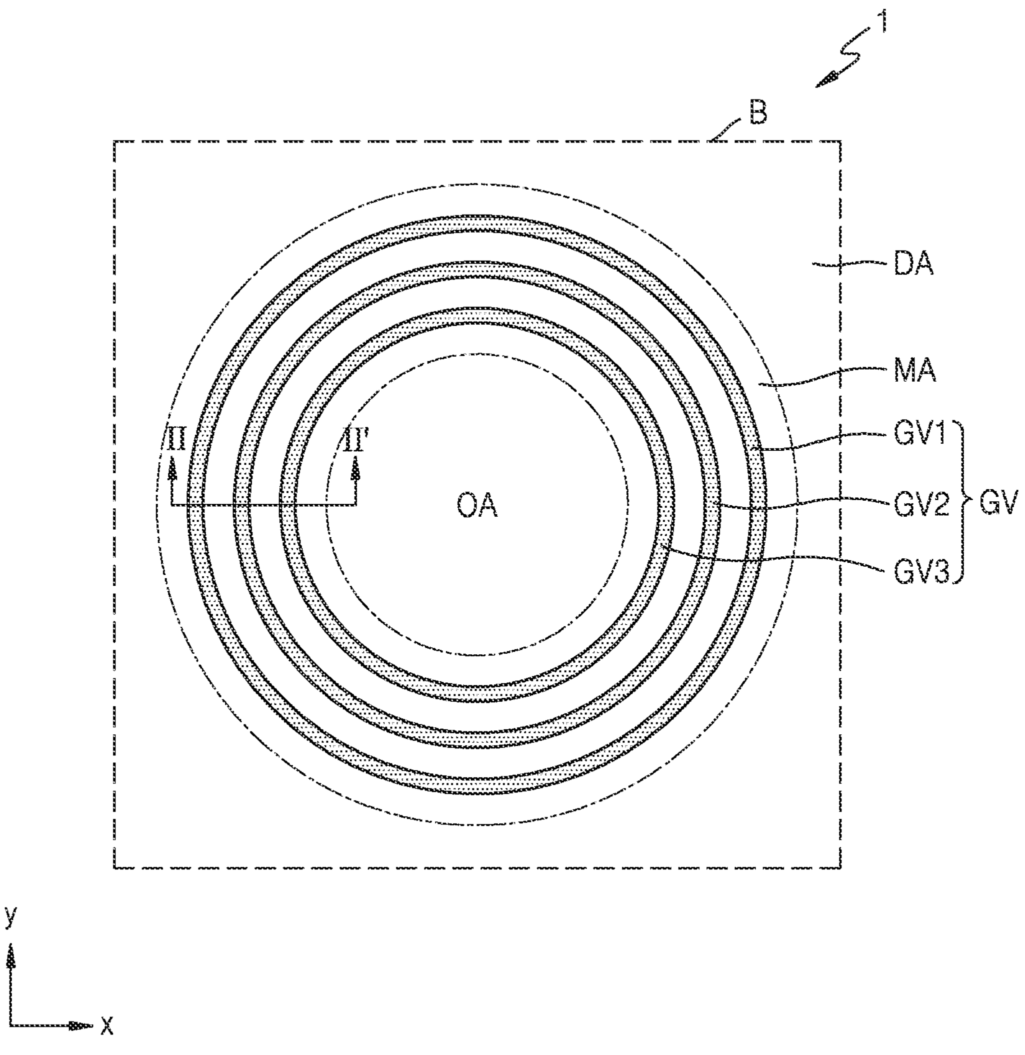
FIG. 8 is a schematic plan view of region B of the display apparatus of FIG. 2, according to one or more embodiments of the present disclosure.

FIG. 8 is a schematic plan view of a portion of a display apparatus according to one or more embodiments of the present disclosure. In detail, FIG. 8 corresponds to an enlargement of region B of FIG. 2. In FIG. 8, reference numerals that are the same as the reference numerals in FIG. 2 denote the same elements of FIG. 2, and thus, their descriptions are not repeated.

Referring to FIG. 8, the display panel 1 may include the display area DA, the opening area OA, and the middle area MA. Here, the display area DA may at least partially surround (or be around) the opening area OA. The middle area MA may be between the display area DA and the opening area OA.

According to one or more embodiments, grooves GV may be arranged (or defined) in the middle area MA. The grooves GV may include a first groove GV1, a second groove GV2, and a third groove GV3. Here, each of the first groove GV1, the second groove GV2, and the third groove GV3 may be arranged (or defined) along a circumference of the opening area OA.

FIG. 8 illustrates that three grooves GV may be arranged (or defined) in the middle area MA. However, the present disclosure is not limited thereto. Only one groove GV, two grooves GV, or four or more grooves GV may be arranged (or defined) in the middle area MA. Like this, various numbers of grooves GV may be arranged in the middle area MA.

Figure 9:
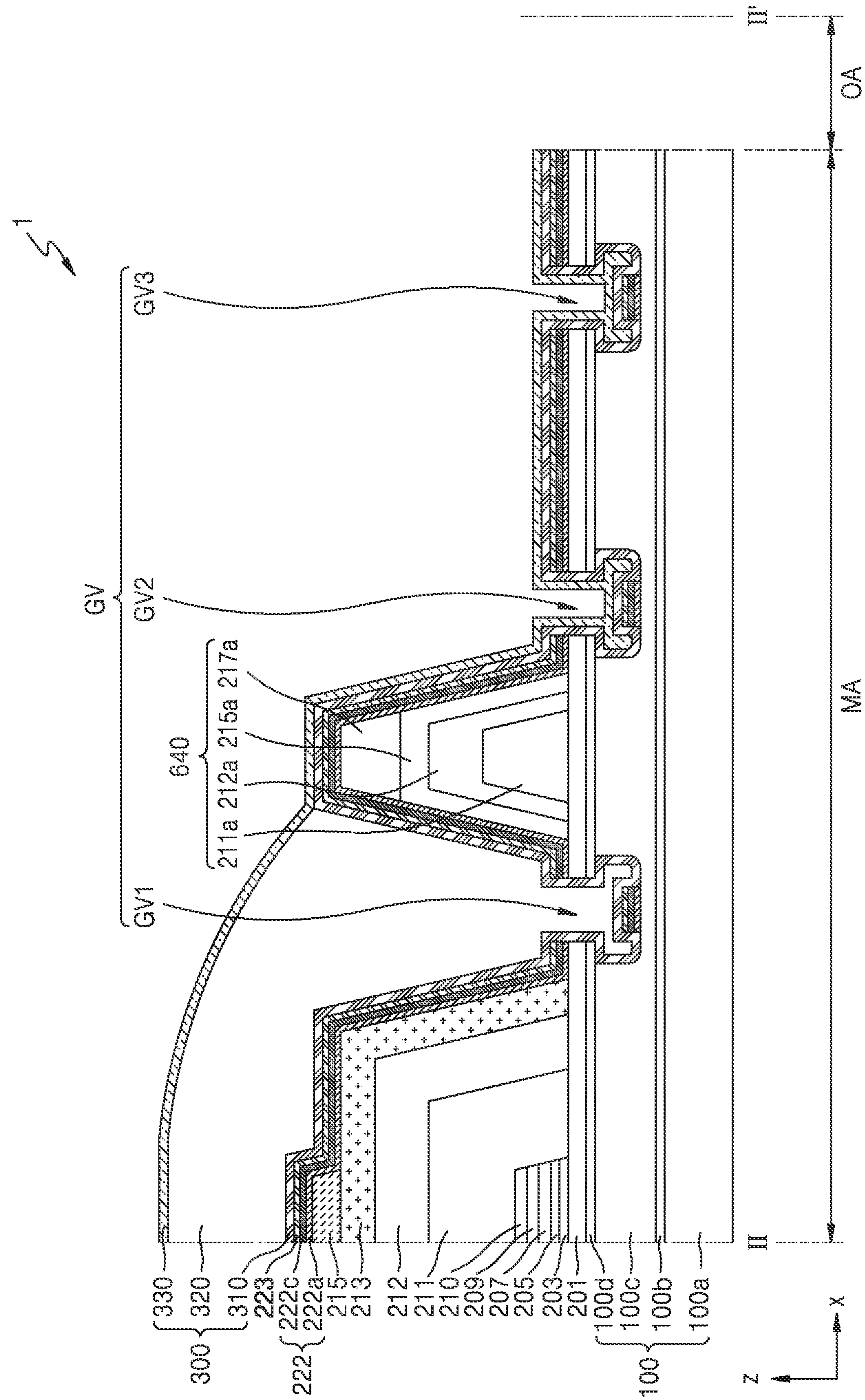
FIG. 9 is a schematic cross-sectional view of a portion of a display apparatus taken along the line II-II' of FIG. 8, according to one or more embodiments of the present disclosure.

FIG. 9 is a schematic cross-sectional view of a portion of a display apparatus according to one or more embodiments of the present disclosure. In detail, FIG. 9 is a cross-sectional view of the display apparatus of FIG. 8, taken along the line II-II'. In FIG. 9, reference numerals that are the same as the reference numerals in FIG. 8 denote the same elements of FIG. 8, and thus, their descriptions are not repeated.

Referring to FIG. 9, the substrate 100 may be arranged in the middle area MA. As described above, the substrate 100 may include the first base layer 100*a*, the first barrier layer 100*b*, the second base layer 100*c*, and the second barrier layer 100*d*.

The buffer layer 201, the first gate insulating layer 203, the first interlayer insulating layer 205, the second interlayer insulating layer 207, the second gate insulating layer 209, and the third interlayer insulating layer 210 may be sequentially arranged on the substrate 100. An opening may be defined in the first gate insulating layer 203, the first interlayer insulating layer 205, the second interlayer insulating layer 207, the second gate insulating layer 209, and the third interlayer insulating layer 210 to correspond to the opening area OA.

Also, the first organic insulating layer 211 may be arranged on the third interlayer insulating layer 210, the second organic insulating layer 212 may be arranged on the first organic insulating layer 211, and the third organic insulating layer 213 may be arranged on the second organic insulating layer 212. The pixel-defining layer 215 may be arranged on the third organic insulating layer 213. The intermediate layer 222 and the opposite electrode 223 may be arranged on the pixel-defining layer 215. For example, the first functional layer 222*a*, the second functional layer 222*c*, and the opposite electrode 223 may be arranged on the pixel-defining layer 215.

According to one or more embodiments, the groove GV and a third dam portion 640 may be arranged in the middle area MA. The grooves GV may include the first groove GV1, the second groove GV2, and the third groove GV3. FIG. 9 illustrates that three grooves GV may be arranged in the middle area MA. However, the present disclosure is not limited thereto. Only one groove GV may be arranged in the middle area MA. In one or more embodiments, two grooves GV or four or more grooves GV may be arranged in the middle area MA. Like this, various modifications are possible.

According to one or more embodiments, the first groove GV1 may be arranged (or defined) between the display area DA (see, e.g., FIG. 8) and the third dam portion 640. However, the present disclosure is not limited thereto. For example, the first groove GV1 may be arranged (or defined) between the third dam portion 640 and the opening area OA. The second groove GV2 and the third groove GV3 may be arranged (or defined) between the third dam portion 640 and the opening area OA.

The organic material layer, for example, the functional layer 222*a* and/or the second functional layer 222*c*, included in the intermediate layer 222 may be disconnected (or insulated) via the groove GV. The middle area MA may be understood as a groove area or a disconnected area (or an insulated area) of the organic material layer.

The groove GV may be formed in the substrate 100. For example, the groove GV may be formed by removing at least a portion of the second base layer 100*c*, the second barrier layer 100*d*, and the buffer layer 201. Thus, a bottom surface of the groove GV may be co-planar with an upper surface of the second base layer 100*c*. However, the present disclosure is not limited thereto. For example, the groove GV may be formed in layers arranged between the substrate 100 and the pixel electrode 221 (see, e.g., FIG. 4). Here, the layers may include a first sub-layer and a second sub-layer.

According to one or more embodiments, the groove GV may have an undercut structure (or an undercut section). After the groove GV is formed, the intermediate layer 222 may be formed. Thus, at least one organic material layer of the intermediate layer 222 may be disconnected or insulated by the groove GV. For example, the first functional layer 222*a* and/or the second functional layer 222*c* may be disconnected or insulated by the groove GV. Also, the opposite electrode 223 may also be disconnected or insulated by the groove GV. The first functional layer 222*a*, the second functional layer 222*c*, and/or at least a portion of the opposite electrode 223 may be arranged in the groove GV. That is, the first functional layer 222*a*, the second functional layer 222*c*, and/or at least a portion of the opposite electrode 223 may be arranged on the bottom surface of the groove GV.

According to one or more embodiments, the third dam portion 640 may include a plurality of sub-layers 211*a*, 212*a*, 215*a*, and 217*a* stacked on the buffer layer 201. The plurality of sub-layers 211*a*, 212*a*, 215*a*, and 217*a* may correspond to a portion of the first organic insulating layer 211, a portion of the second organic insulating layer 212, a portion of the pixel-defining layer 215, and a portion of the spacer 217 (see, e.g., FIG. 4), respectively. In this case, a height from the substrate 100 to an upper surface of the third dam portion 640 may be less than a height from the substrate 100 to an upper surface of the spacer 217 (see, e.g., FIG. 4) in the display area DA (see, e.g., FIG. 4). However, the present disclosure is not limited thereto. The height from the substrate 100 to the upper surface of the third dam portion 640 may be equal to or greater than the height from the substrate 100 to the upper surface of the spacer 217 (see, e.g., FIG. 4) in the display area DA (see, e.g., FIG. 4).

FIG. 9 illustrates that one dam portion (for example, the third dam portion 640) may be arranged in the middle area MA. However, the present disclosure is not limited thereto. Two or more dam portions may be arranged in the middle area MA.

According to one or more embodiments, the encapsulation layer 300 may be arranged on the opposite electrode 223. The encapsulation layer 300 may include the first inorganic encapsulation layer 310, the organic encapsulation layer 320, and the second inorganic encapsulation layer 330. The first inorganic encapsulation layer 310 may have a relatively superior step coverage, and thus, may be continually formed to cover an inner surface of the groove GV. The first inorganic encapsulation layer 310 may cover the first functional layer 222*a*, the second functional layer 222*c*, and/or the opposite electrode 223 arranged on the bottom surface of the groove GV and insulated from each other.

The organic encapsulation layer 320 may be arranged between the first inorganic encapsulation layer 310 and the second inorganic encapsulation layer 330, and an end of the organic encapsulation layer 320 may be arranged adjacent to a side of the third dam portion 640. The organic encapsulation layer 320 may be arranged in an inner space of a groove GV which is adjacent to the display area DA from among the grooves GV. That is, the first groove GV1 may be filled with the organic encapsulation layer 320.

The second inorganic encapsulation layer 330 may have a relatively superior step coverage, similarly to the first inorganic encapsulation layer 310. Thus, the second inorganic encapsulation layer 330 may be continually formed along an inner surface of a groove GV which is not covered by the organic encapsulation layer 320 from among the grooves GV.

Figure 10:
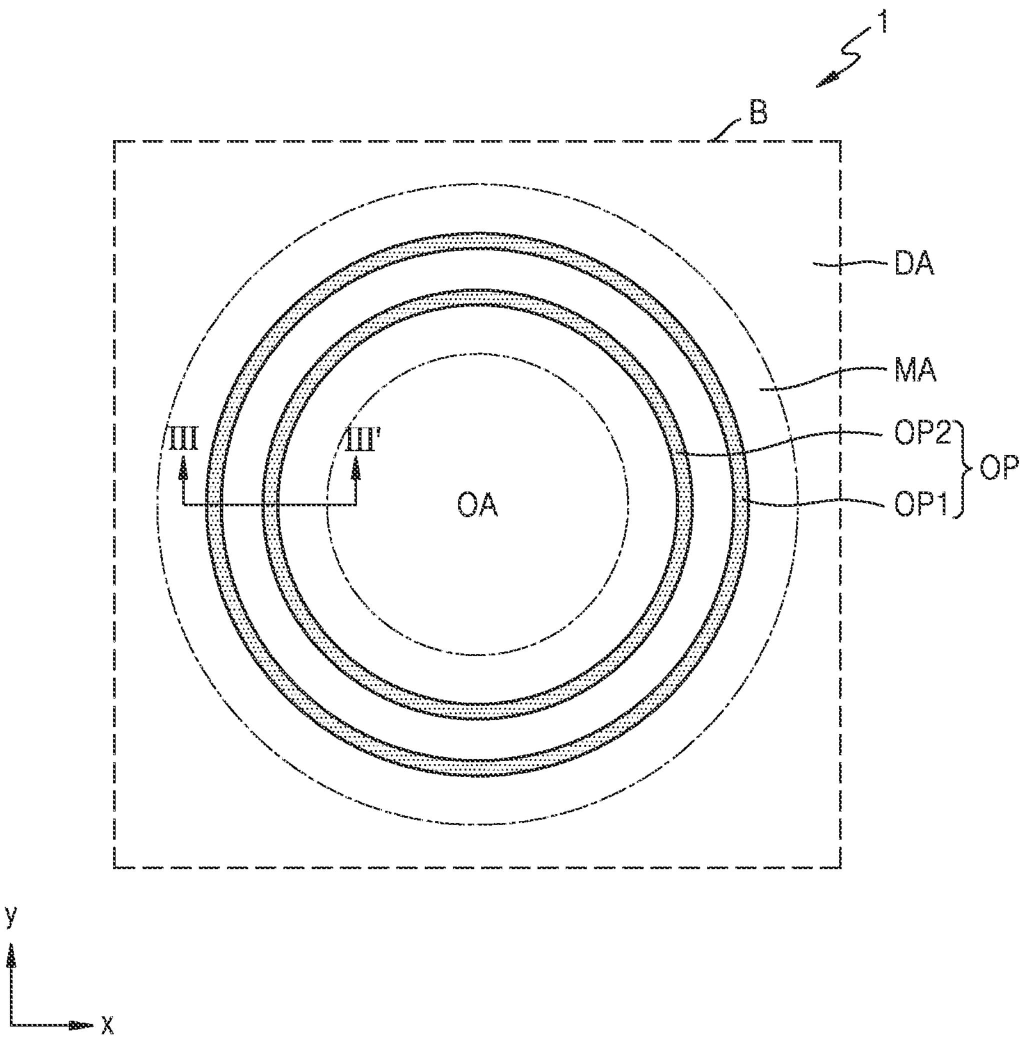
FIG. 10 is a schematic plan view of region B of the display apparatus of FIG. 2, according to one or more embodiments of the present disclosure.

FIG. 10 is a schematic plan view of a portion of a display apparatus according to one or more embodiments of the present disclosure. The embodiment of FIG. 10 is different from the embodiment of FIG. 8 in that openings OP may be defined in the middle area MA. In FIG. 10, reference numerals that are the same as the reference numerals in FIG. 8 denote the same elements of FIG. 8, and thus, their descriptions are not repeated.

Referring to FIG. 10, the display panel 1 may include the display area DA, the opening area OA, and the middle area MA. Here, the display area DA may at least partially surround (or be around) the opening area OA. The middle area MA may be between the display area DA and the opening area OA.

According to one or more embodiments, the openings OP may be arranged (or defined) in the middle area MA. The openings OP may include a first opening OP1 and a second opening OP2. Here, each of the first and second openings OP1 and OP2 may be arranged along a circumference of the opening area OA.

FIG. 10 illustrates that two openings OP may be arranged (or defined) in the middle area MA. However, the present disclosure is not limited thereto. Only one opening OP may be arranged (or defined) or three or more openings OP may be arranged (or defined) in the middle area MA. Like this, various numbers of openings OP may be arranged (or defined) in the middle area MA.

Figure 11:
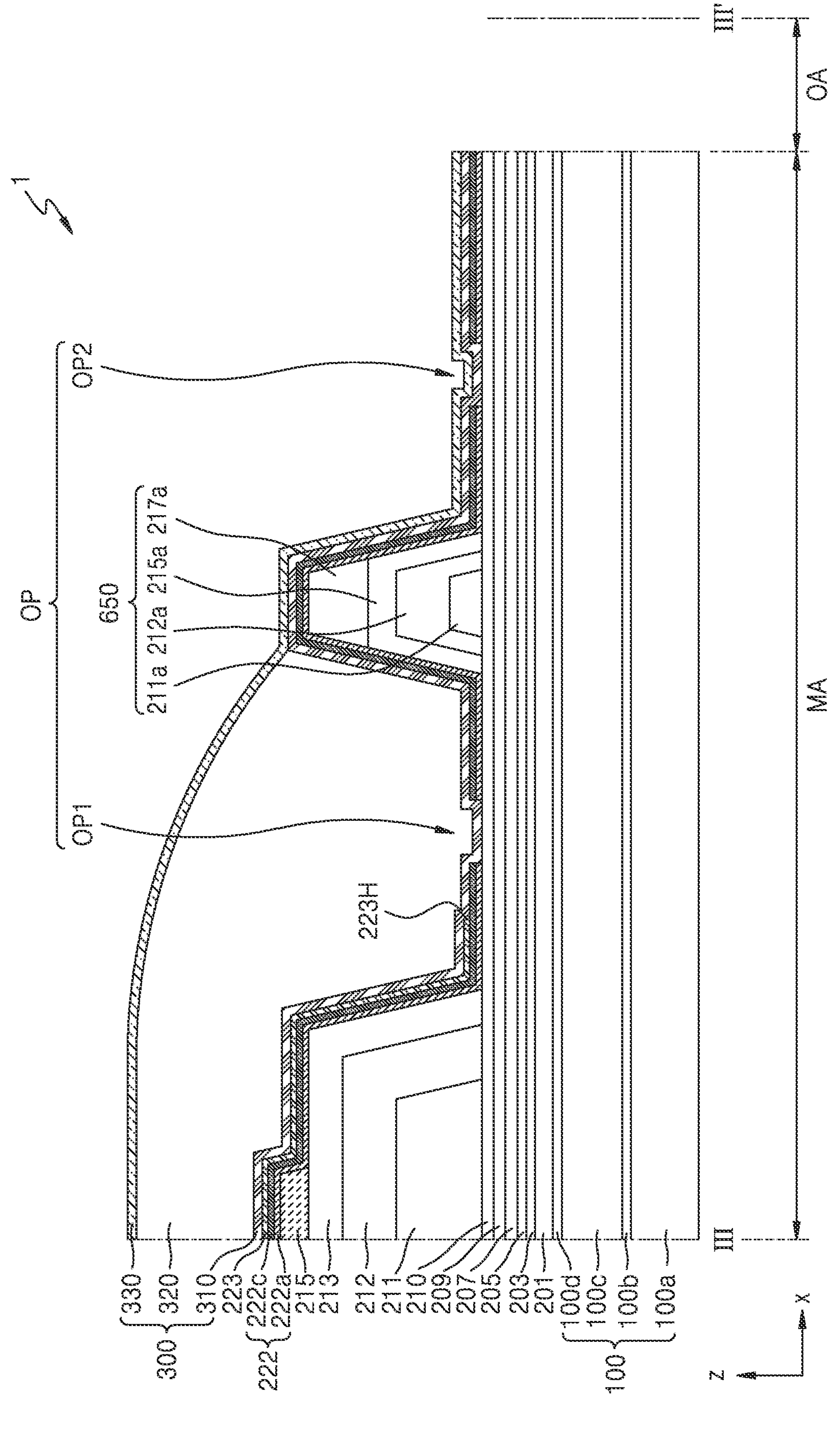
FIG. 11 is a schematic cross-sectional view of a portion of a display apparatus taken along the line III-III' of FIG. 10, according to one or more embodiments of the present disclosure.

FIG. 11 is a schematic cross-sectional view of a portion of a display apparatus according to one or more embodiments of the present disclosure. In detail, FIG. 11 is a cross-sectional view of the display apparatus of FIG. 10, taken along the line III-III'. In FIG. 11, reference numerals that are the same as the reference numerals in FIG. 9 denote the same elements of FIG. 9, and thus, their descriptions are not repeated.

Referring to FIG. 11, according to one or more embodiments, the intermediate layer 222 may be arranged in the middle area MA. The intermediate layer 222 may be arranged in the display area DA (see, e.g., FIG. 10), and at least a portion of the intermediate layer 222 may extend from the display area DA to the middle area MA. The intermediate layer 222 may include the first functional layer 222*a* and the second functional layer 222*c*.

According to one or more embodiments, the intermediate layer 222 may be disconnected (or insulated) in the middle area MA. In detail, the first and second functional layers 222*a* and 222*c* may be disconnected (or insulated) in the middle area MA. The openings OP may be defined in the first and second functional layers 222*a* and 222*c* arranged in the middle area MA.

According to one or more embodiments, the openings OP and a fourth dam portion 650 may be defined (or arranged) in the middle area MA. The openings OP may include the first opening OP1 and the second opening OP2. FIG. 11 illustrates that two openings OP may be defined (or arranged) in the middle area MA. However, the present disclosure is not limited thereto. Only one opening OP may be defined (or arranged) in the middle area MA. In one or more embodiments, three or more openings OP may be defined (or arranged) in the middle area MA. Like this, various modifications are possible.

According to one or more embodiments, the first opening OP1 may be arranged (or defined) between the display area DA (see, e.g., FIG. 10) and the fourth dam portion 650. However, the present disclosure is not limited thereto. For example, the first opening OP1 may be defined (or arranged) between the fourth dam portion 650 and the opening area OA. The second opening OP2 may be defined (or arranged) between the fourth dam portion 650 and the opening area OA.

According to one or more embodiments, the fourth dam portion 650 may include the plurality of sub-layers 211*a*, 212*a*, 215*a*, and 217*a*. The plurality of sub-layers 211*a*, 212*a*, 215*a*, and 217*a* may correspond to a portion of the first organic insulating layer 211, a portion of the second organic insulating layer 212, a portion of the pixel-defining layer 215, and a portion of the spacer 217 (see, e.g., FIG. 4), respectively. FIG. 11 illustrates that one dam portion (for example, the fourth dam portion 650) may be arranged in the middle area MA. However, the present disclosure is not limited thereto. Two or more dam portions may be arranged in the middle area MA.

According to one or more embodiments, at least one opening OP may be defined in the first functional layer 222*a* and the second functional layer 222*c*, and thus, the penetration (or diffusion) of oxygen or moisture around the opening area OA into the organic light-emitting diodes OLED of the display area DA may be prevented or minimized.

According to one or more embodiments, the opposite electrode 223 may be arranged in the middle area MA. The opposite electrode 223 may be arranged in the display area DA (see, e.g., FIG. 10), and at least a portion of the opposite electrode 223 may extend from the display area DA to the middle area MA.

According to one or more embodiments, the opposite electrode 223 may be disconnected in the middle area MA. The opposite electrode 223 arranged in the middle area MA may include a hole 223H corresponding to the opening area OA. The hole 223H defined in the opposite electrode 223 may be in the middle area MA.

An area of the hole 223H defined in the opposite electrode 223 may be greater than an area of the opening area OA. When the area of the hole 223H defined in the opposite electrode 223 is greater than the area of the opening area OA, the penetration (or diffusion) of oxygen or moisture around the opening area OA into the organic light-emitting diode OLED (see, e.g., FIG. 4) of the display area DA may be prevented or minimized.

The encapsulation layer 300 may be arranged in the middle area MA. The encapsulation layer 300 may be arranged in the display area DA, and at least a portion of the encapsulation layer 300 may extend from the display area DA to the middle area MA. According to one or more embodiments, the encapsulation layer 300 may include the first inorganic encapsulation layer 310, the organic encapsulation layer 320, and the second inorganic encapsulation layer 330 that are sequentially stacked. Each of the first inorganic encapsulation layer 310, the organic encapsulation layer 320, and the second inorganic encapsulation layer 330 may extend from the display area DA to the middle area MA.

The organic encapsulation layer 320 may be formed by applying a monomer and curing the same, and flowing of the monomer for forming the organic encapsulation layer 320 may be controlled by the fourth dam portion 650. That is, the fourth dam portion 650 may be arranged in the middle area MA, to prevent or minimize the flowing of the monomer for forming the organic encapsulation layer 320 toward the opening area OA. For example, an end of the organic encapsulation layer 320 may be arranged at a side of the fourth dam portion 650.

Because an end of the organic encapsulation layer 320 may be arranged at a side of the fourth dam portion 650, the first inorganic encapsulation layer 310 and the second inorganic encapsulation layer 330 may directly contact each other on an upper surface of the fourth dam portion 650.

The encapsulation layer 300 may overlap at least one opening OP defined in the intermediate layer 222. The first inorganic encapsulation layer 310, the organic encapsulation layer 320, and the second inorganic encapsulation layer 330 of the encapsulation layer 300 may overlap the first opening OP1 defined in the intermediate layer 222.

FIGS. 12 through 22 are schematic cross-sectional views for describing a method of manufacturing a display apparatus, according to one or more embodiments of the present disclosure.

Hereinafter, the method of manufacturing a display apparatus is sequentially described with reference to FIGS. 12 through 22.

Referring to FIGS. 4, 7, and 12 through 22, the method of manufacturing a display apparatus may include: forming a first pattern material 1200M in the display area DA and the adhesion area AA; forming the first connection pattern 160 by etching the first pattern material 1200M in the display area DA and forming the conductive pattern 110 by etching the first pattern material 1200M in the adhesion area AA; forming the first organic insulating layer 211 on the first connection pattern 160; forming a second pattern material 1300M on the first organic insulating layer 211 and the conductive pattern 110; forming the second connection pattern 170 by etching the second pattern material 1300M on the first organic insulating layer 211 and forming a protection layer 120 by etching the second pattern material 1300M on the conductive pattern 110; and etching a portion of the protection layer 120.

Figure 12:
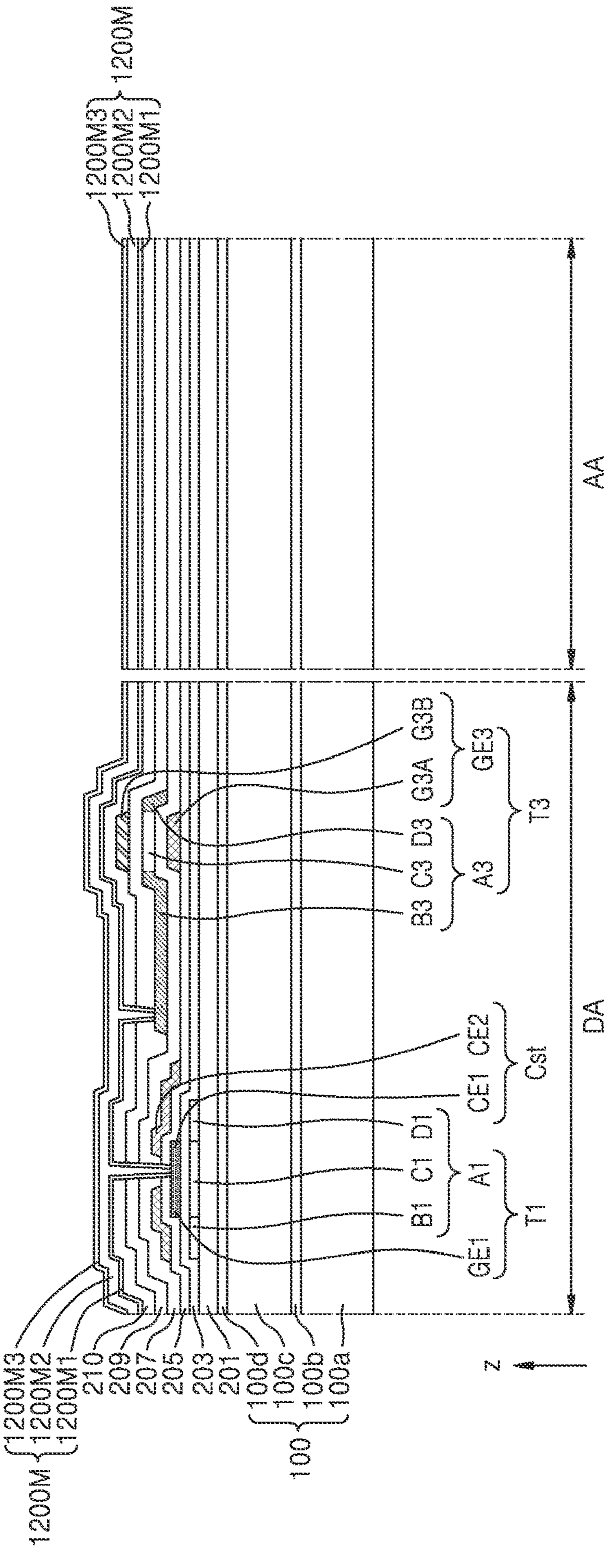
FIGS. 12 through 22 are schematic cross-sectional views for describing a method of manufacturing a display apparatus, according to one or more embodiments of the present disclosure.

First, referring to FIG. 12, an operation of forming the first pattern material 1200M in the display area DA and the adhesion area AA may be performed.

According to one or more embodiments, the substrate 100 may include the display area DA and the adhesion area AA. The buffer layer 201 may be formed on the substrate 100 in the display area DA and on the substrate 100 in the adhesion area AA.

The driving semiconductor layer A1 of the driving transistor T1 may be formed on the buffer layer 201 in the display area DA. The driving semiconductor layer A1 may include the channel area C1 and the first area B1 and the second area D1 arranged at respective sides of the channel area C1.

The first gate insulating layer 203 may be formed on the driving semiconductor layer A1 in the display area DA and on the buffer layer 201 in the adhesion area AA. The driving gate electrode GE1 may be formed on the first gate insulating layer 203 in the display area DA. The first interlayer insulating layer 205 may be formed on the driving gate electrode GE1 in the display area DA and on the first gate insulating layer 203 in the adhesion area AA.

The second capacitor electrode CE2 may be formed on the first interlayer insulating layer 205 in the display area DA. The second interlayer insulating layer 207 may be formed on the second capacitor electrode CE2 in the display area DA and on the first interlayer insulating layer 205 in the adhesion area AA.

The compensation semiconductor layer A3 of the compensation transistor T3 may be formed on the second interlayer insulating layer 207 in the display area DA. The second gate insulating layer 209 may be formed on the compensation semiconductor layer A3 in the display area DA and on the second interlayer insulating layer 207 in the adhesion area AA.

The upper gate electrode G3B may be formed on the second gate insulating layer 209 in the display area DA. The third interlayer insulating layer 210 may be formed on the upper gate electrode G3B in the display area DA and on the second gate insulating layer 209 in the adhesion area AA.

According to one or more embodiments, the first pattern material 1200M may be formed in the display area DA and the adhesion area AA. In detail, the first pattern material 1200M may be formed on the third interlayer insulating layer 210 in the display area DA and the adhesion area AA. The first pattern material 1200M may be generally formed both in the display area DA and the adhesion area AA.

According to one or more embodiments, the first pattern material 1200M may include a first material 1200M1, a second material 1200M2, and a third material 1200M3. However, the present disclosure is not limited thereto. The first pattern material 1200M may include only one material. In one or more embodiments, the first pattern material 1200M may include two materials. Like this, various modifications are possible.

The first material 1200M1, the second material 1200M2, and the third material 1200M3 may be sequentially formed on the third interlayer insulating layer 210. Each of the first through third materials 1200M1 through 1200M3 may include at least one of Al, Cu, and/or Ti. For example, the first material 1200M1 and the third material 1200M3 may include Ti, and the second material 1200M2 may include Al. However, the present disclosure is not limited thereto.

Figure 13:
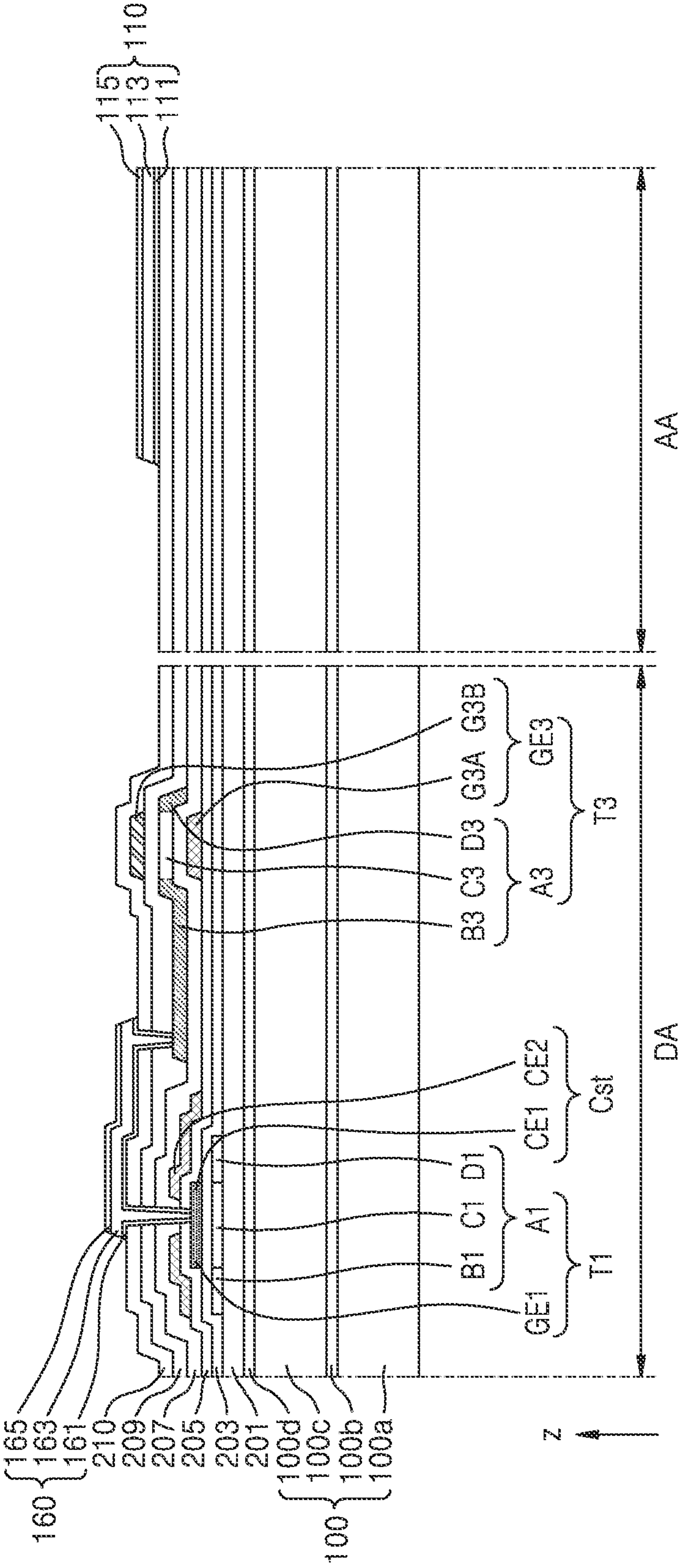

Referring to FIG. 13, an operation of forming the first connection pattern 160 by etching the first pattern material 1200M in the display area DA and forming the conductive pattern 110 by etching the first pattern material 1200M in the adhesion area AA may be performed.

According to one or more embodiments, the first connection pattern 160 may be formed by etching the first pattern material 1200M in the display area DA. Here, the first pattern material 1200M may be etched by using a dry etching method. However, the present disclosure is not limited thereto. The first pattern material 1200M may be etched by using a wet etching method.

Also, during the etching of the first pattern material 1200M in the display area DA, the first pattern material 1200M in the adhesion area AA may also be etched concurrently. Thus, the first connection pattern 160 may be formed by etching the first pattern material 1200M in the display area DA, and the conductive pattern 110 may be formed by etching the first pattern material 1200M in the adhesion area AA.

Because the first pattern material 1200M may include the first material 1200M1, the second material 1200M2, and the third material 1200M3, the first connection pattern 160 formed by etching the first pattern material 1200M may include the first layer 161, the second layer 163, and the third layer 165. The first layer 161 and the third layer 165 may include Ti, and the second layer 163 may include Al. However, the present disclosure is not limited thereto.

Because the first pattern material 1200M may include the first material 1200M1, the second material 1200M2, and the third material 1200M3, the conductive pattern 110 formed by etching the first pattern material 1200M may include the first conductive layer 111, the second conductive layer 113, and the third conductive layer 115. The first conductive layer 111 and the third conductive layer 115 may include Ti, and the second conductive layer 113 may include Al. However, the present disclosure is not limited thereto.

Because the first layer 161 and the first conductive layer 111 may be formed by etching the first material 1200M1, the first layer 161 and the first conductive layer 111 may include the same material as each other. Also, because the second layer 163 and the second conductive layer 113 may be formed by etching the second material 1200M2, the second layer 163 and the second conductive layer 113 may include the same material as each other. Because the third layer 165 and the third conductive layer 115 may be formed by etching the third material 1200M3, the third layer 165 and the third conductive layer 115 may include the same material as each other.

Figure 14:
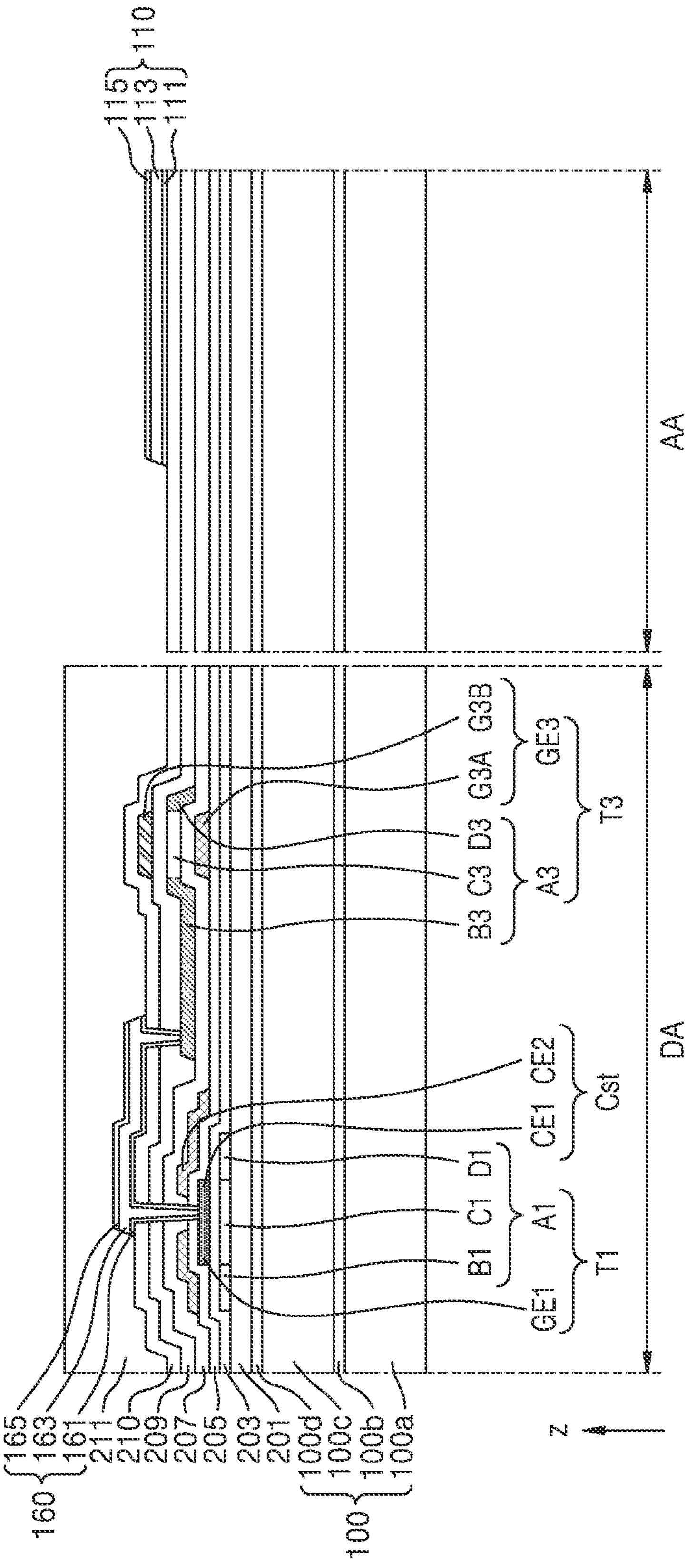

Referring to FIG. 14, an operation of forming the first organic insulating layer 211 on the first connection pattern 160 may be performed. In detail, the first organic insulating layer 211 may be formed on the first connection pattern 160 in the display area DA.

Figure 15:
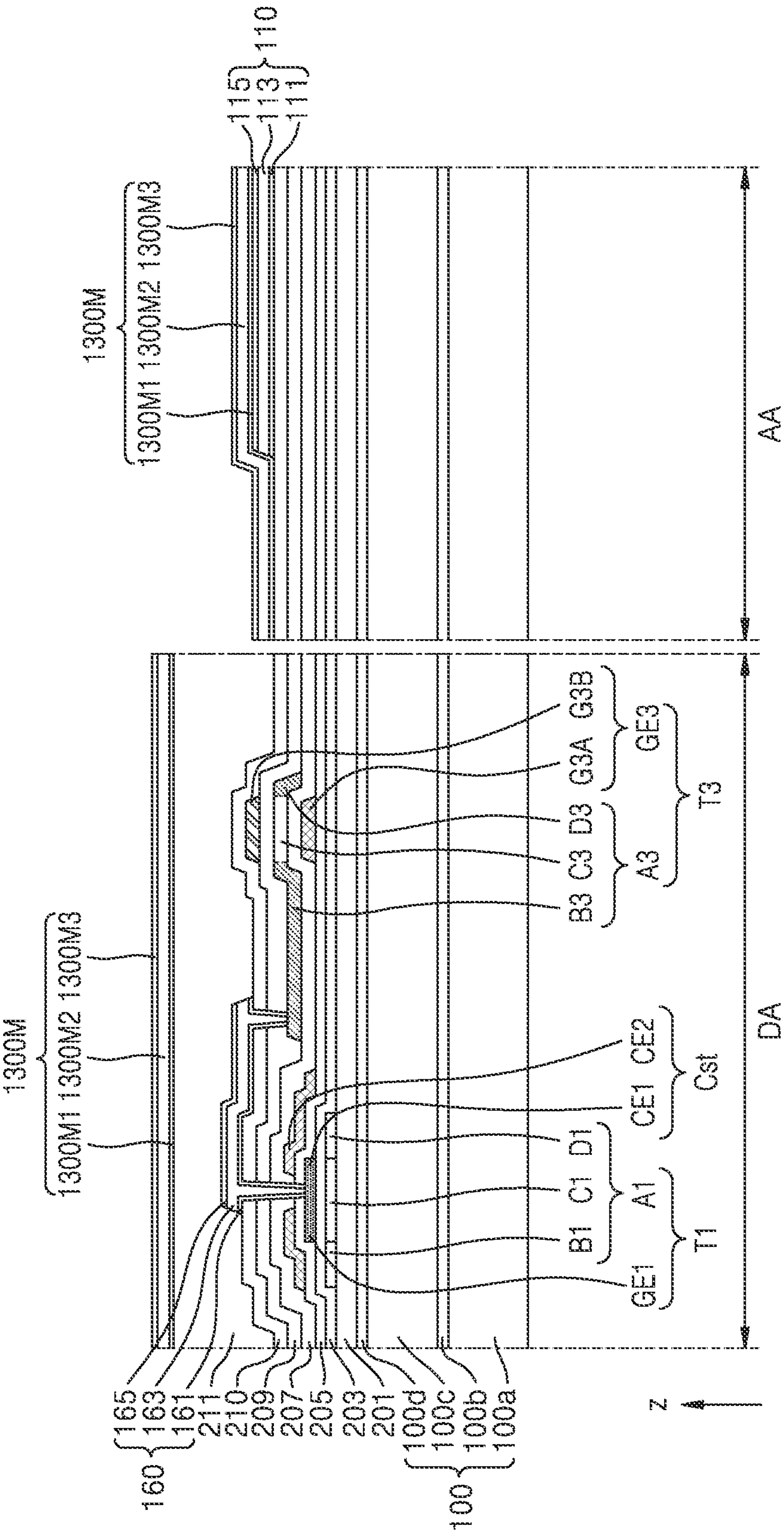

Referring to FIG. 15, an operation of forming the second pattern material 1300M on the first organic insulating layer 211 and the conductive pattern 110 may be performed. According to one or more embodiments, the second pattern material 1300M may be formed in the display area DA and the adhesion area AA. In detail, the second pattern material 1300M may be formed on the first organic insulating layer 211 in the display area DA and on the conductive pattern 110 in the adhesion area AA. The second pattern material 1300M may be generally formed both in the display area DA and the adhesion area AA.

According to one or more embodiments, the second pattern material 1300M may include a fourth material 1300M1, a fifth material 1300M2, and a sixth material 1300M3. However, the present disclosure is not limited thereto. The second pattern material 1300M may include only one material. In one or more embodiments, the second pattern material 1300M may include two materials. Like this, various modifications are possible.

The fourth material 1300M1, the fifth material 1300M2, and the sixth material 1300M3 may be sequentially formed on each of the first organic insulating layer 211 and the conductive pattern 110. Each of the fourth material 1300M1, the fifth material 1300M2, and the sixth material 1300M3 may include one of Al, Cu, and/or Ti. For example, the fourth material 1300M1 and the sixth material 1300M3 may include Ti, and the fifth material 1300M2 may include Al. However, the present disclosure is not limited thereto.

Figure 16:
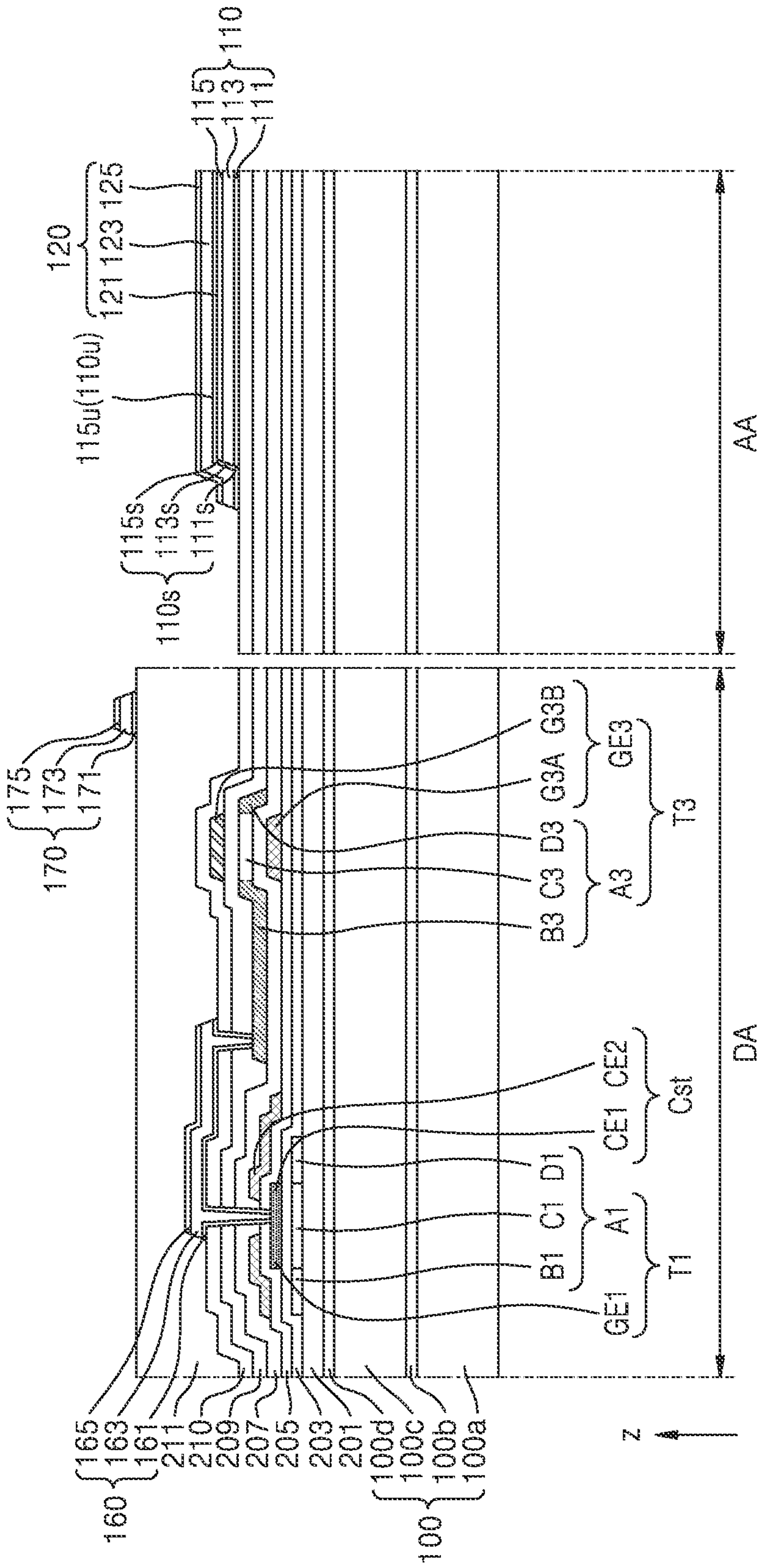

Referring to FIG. 16, an operation of forming the second connection pattern 170 by etching the second pattern material 1300M on the first organic insulating layer 211 and forming the protection layer 120 by etching the second pattern material 1300M on the conductive pattern 110 may be performed.

According to one or more embodiments, the second connection pattern 170 may be formed by etching the second pattern material 1300M in the display area DA. Here, the second pattern material 1300M may be etched by using a dry etching method. However, the present disclosure is not limited thereto. The second pattern material 1300M may be etched by using a wet etching method.

Also, while the second pattern material 1300M in the display area DA is etched, the second pattern material 1300M in the adhesion area AA may also be etched concurrently. Thus, the second connection pattern 170 may be formed by etching the second pattern material 1300M in the display area DA, and the protection layer 120 may be formed by etching the second pattern material 1300M in the adhesion area AA.

Because the second pattern material 1300M may include the fourth through sixth materials 1300M1 through 1300M3, the second connection pattern 170 formed by etching the second pattern material 1300M may include the fourth layer 171, the fifth layer 173, and the sixth layer 175. The fourth layer 171 and the sixth layer 175 may include Ti, and the fifth layer 173 may include Al. However, the present disclosure is not limited thereto.

Because the second pattern material 1300M may include the fourth through sixth materials 1300M1 through 1300M3, the protection layer 120 formed by etching the second pattern material 1300M may include the cover layer 121, a first protection layer 123, and a second protection layer 125. The cover layer 121, the first protection layer 123, and the second protection layer 125 of the protection layer 120 may be sequentially stacked in a thickness direction (for example, a z direction) of the substrate 100. The cover layer 121 and the second protection layer 125 may include Ti, and the first protection layer 123 may include Al. However, the present disclosure is not limited thereto.

According to one or more embodiments, the protection layer 120 may cover the side surface 110*s* and at least a portion of the upper surface 110*u* of the conductive pattern 110. The cover layer 121 of the protection layer 120 may cover the side surface 110*s* of the conductive pattern 110 and at least a portion of the upper surface 110*u* of the conductive pattern 110. In detail, the cover layer 121 may cover the side surface 111*s* of the first conductive layer 111, the side surface 113*s* of the second conductive layer 113, the side surface 115*s* of the third conductive layer 115, and at least a portion of the upper surface 115*u* of the third conductive layer 115.

Because the cover layer 121 of the protection layer 120 may cover the side surface 110*s* and at least the portion of the upper surface 110*u* of the conductive pattern 110, occurrence of an undercut in the conductive pattern 110, for example, the side surface 113*s* of the second conductive layer 113, in subsequent processes may be prevented or minimized. Accordingly, the organic light-emitting diode OLED (see, e.g., FIG. 4) arranged in the display area DA may be protected (or substantially protected) from external moisture and oxygen.

Figure 17:
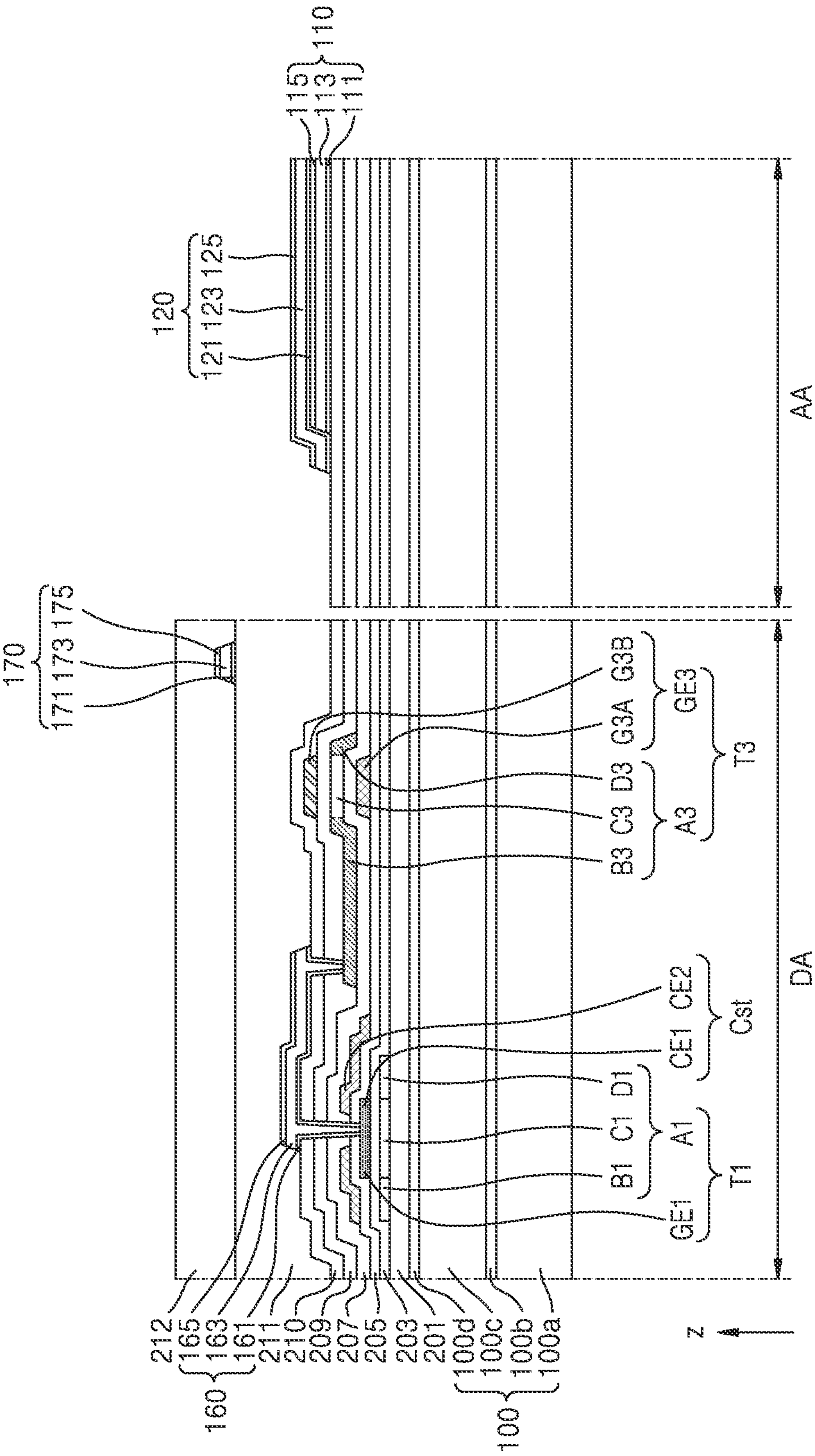

Referring to FIG. 17, an operation of forming the second organic insulating layer 212 on the second connection pattern 170 may be performed. In detail, the second organic insulating layer 212 may be formed on the second connection pattern 170 in the display area DA.

Figure 18:
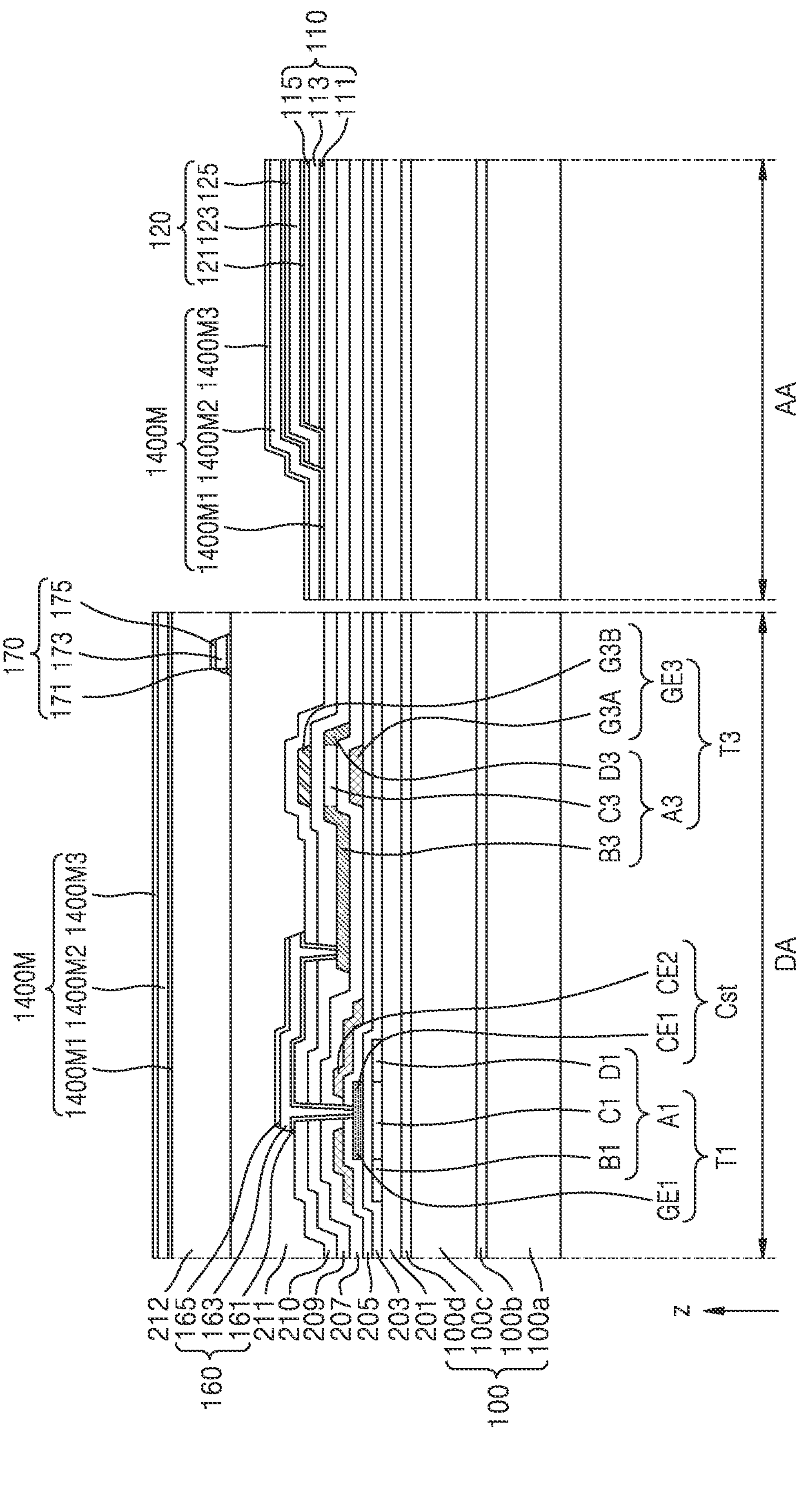

Referring to FIG. 18, an operation of forming a third pattern material 1400M on the second organic insulating layer 212 and the protection layer 120 may be performed. According to one or more embodiments, the third pattern material 1400M may be formed in the display area DA and the adhesion area AA. In detail, the third pattern material 1400M may be formed on the second organic insulating layer 212 in the display area DA and on the protection layer 120 in the adhesion area AA. The third pattern material 1400M may be generally formed both in the display area DA and the adhesion area AA.

According to one or more embodiments, the third pattern material 1400M may include a seventh material 1400M1, an eighth material 1400M2, and a ninth material 1400M3. However, the present disclosure is not limited thereto. The third pattern material 1400M may include only one material. In one or more embodiments, the third pattern material 1400M may include two materials. Like this, various modifications are possible.

The seventh material 1400M1, the eighth material 1400M2, and the ninth material 1400M3 may be sequentially formed on each of the second organic insulating layer 212 and the protection layer 120. Each of the seventh through ninth materials 1400M1 through 1400M3 may include one of Al, Cu, and/or Ti. For example, the seventh material 1400M1 and the ninth material 1400M3 may include Ti, and the eighth material 1400M2 may include Al. However, the present disclosure is not limited thereto.

Figure 19:
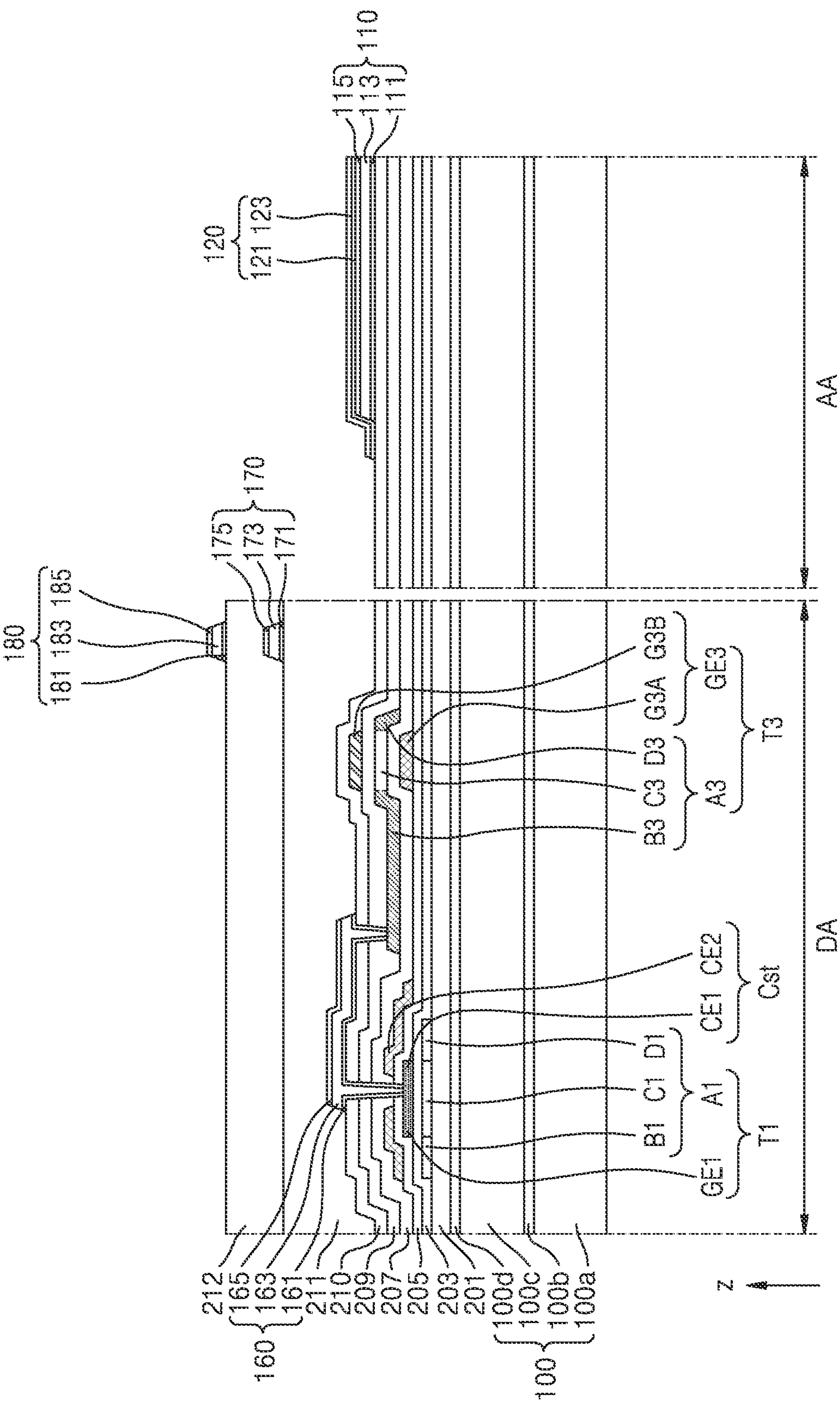

Referring to FIG. 19, an operation of forming the third connection pattern 180 by etching the third pattern material 1400M on the second organic insulating layer 212 and removing the third pattern material 1400M on the protection layer 120, the second protection layer 125, and a portion of the first protection layer 123 may be performed.

According to one or more embodiments, the third connection pattern 180 may be formed by etching the third pattern material 1400M in the display area DA. Here, the third pattern material 1400M may be etched by dry etching. However, the present disclosure is not limited thereto. The third pattern material 1400M may also be etched by wet etching.

Also, while the third pattern material 1400M in the display area DA is etched, the third pattern material 1400M in the adhesion area AA, the second protection layer 125, and a portion of the first protection layer 123 may be removed together. Thus, the third connection pattern 180 may be formed by etching the third pattern material 1400M in the display area DA, and the third pattern material 1400M in the adhesion area AA, the second protection layer 125, and a portion of the first protection layer 123 may be removed.

Because the third pattern material 1400M may include the seventh through ninth materials 1400M1 through 1400M3, the third connection pattern 180 formed by etching the third pattern material 1400M may include the seventh layer 181, the eighth layer 183, and the ninth layer 185. The seventh layer 181 and the ninth layer 185 may include Ti, and the eighth layer 183 may include Al. However, the present disclosure is not limited thereto.

According to one or more embodiments, the third pattern material 1400M in the adhesion area AA may be completely removed. Also, the second protection layer 125 arranged below the third pattern material 1400M may also be completely removed. However, only a portion of the first protection layer 123 arranged below the second protection layer 125 may be removed. Thus, the cover layer 121 and remaining portions of the first protection layer 123 may be arranged on the conductive pattern 110.

Figure 20:
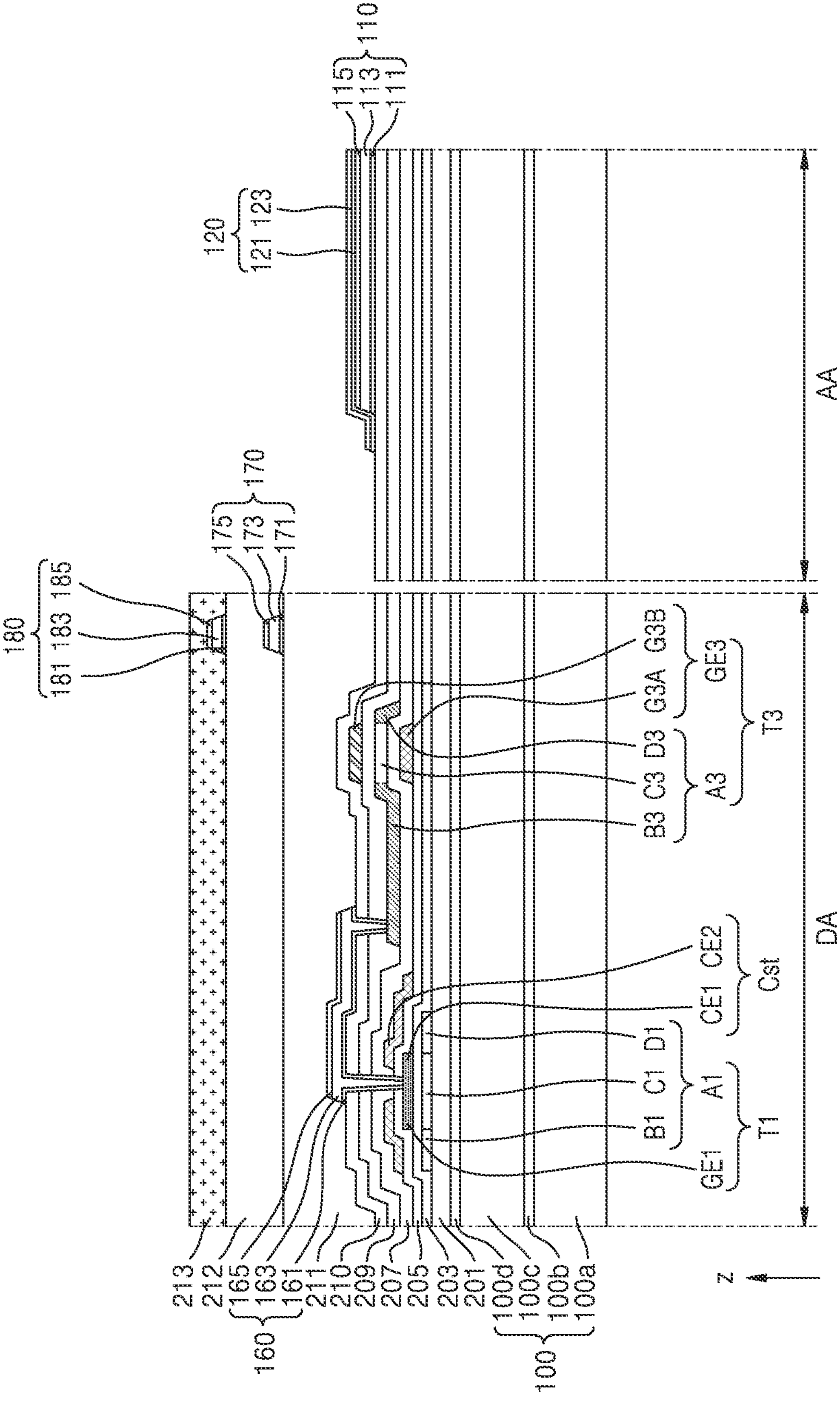

Referring to FIG. 20, an operation of forming the third organic insulating layer 213 on the third connection pattern 180 may be performed. In detail, the third organic insulating layer 213 may be formed on the third connection pattern 180 in the display area DA.

Figure 21:
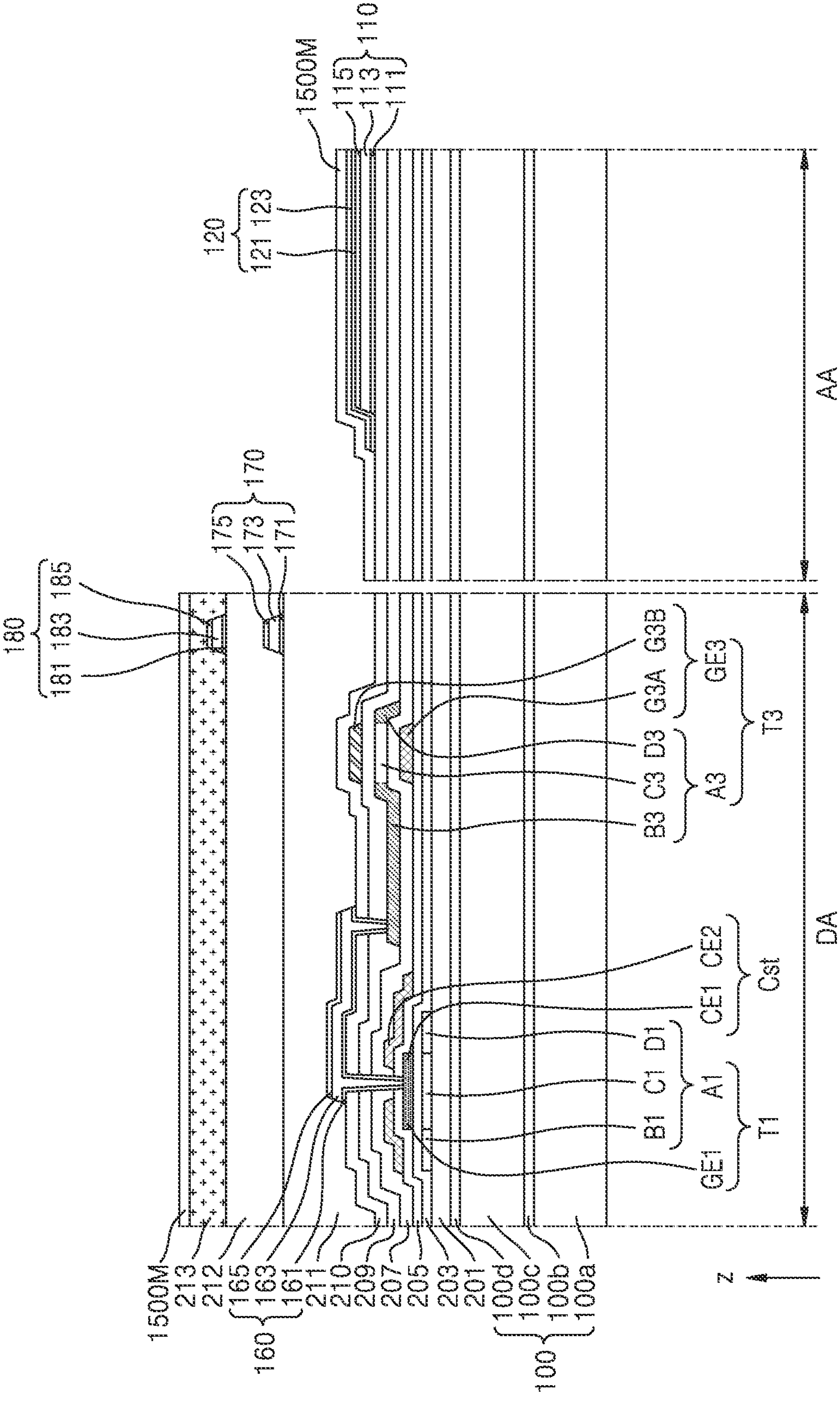

Referring to FIG. 21, an operation of forming a fourth pattern material 1500M on the third organic insulating layer 213 and the first protection layer 123 may be performed. According to one or more embodiments, the fourth pattern material 1500M may be formed in the display area DA and the adhesion area AA. In detail, the fourth pattern material 1500M may be formed on the third organic insulating layer 213 in the display area DA and on the first protection layer 123 in the adhesion area AA. Here, the fourth pattern material 1500M may be formed on the first protection layer 123, a portion of which is removed.

The fourth pattern material 1500M may be generally formed both in the display area DA and the adhesion area AA.

According to one or more embodiments, the fourth pattern material 1500M may include a reflective layer including Ag, Mg, Al, Pt, Pd, Au, Ni, Nd, Ir, Cr, and/or a compound thereof. In one or more embodiments, the fourth pattern material 1500M may further include a conductive oxide layer above and/or below the reflective layer described above. The conductive oxide layer may include ITO, IZO, ZnO, $In_2O_3$, IGO, and/or AZO. According to one or more embodiments, the fourth pattern material 1500M may have a structure in which a conductive oxide layer, a reflective layer, and a conductive oxide layer are stacked. For example, the fourth pattern material 1500M may have a triple-layered structure of ITO/Ag/ITO layers. However, the present disclosure is not limited thereto.

Figure 22:
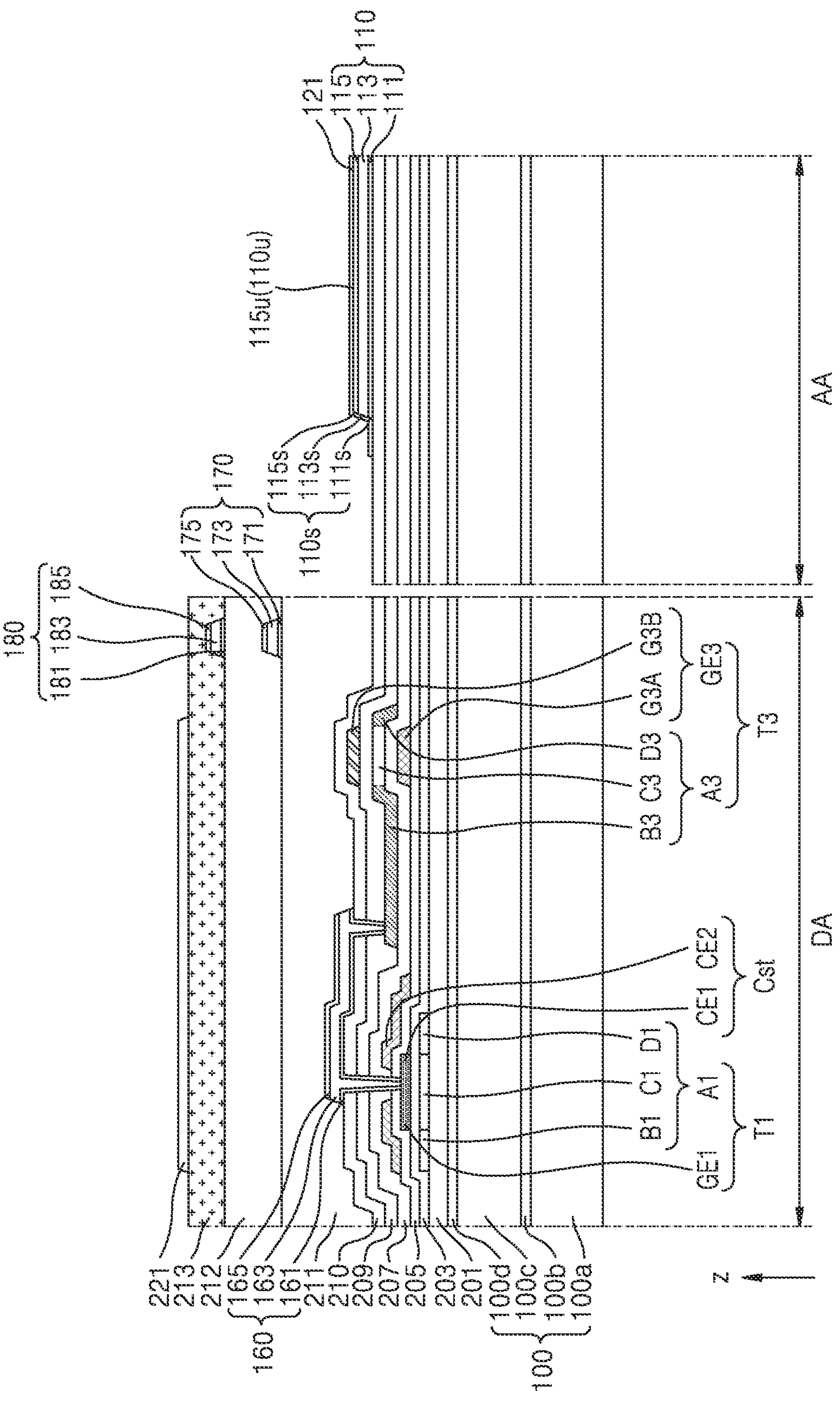

Referring to FIG. 22, an operation of forming the pixel electrode 221 by etching the fourth pattern material 1500M on the third organic insulating layer 213 and removing the fourth pattern material 1500M on the first protection layer 123 and the remaining portions of the first protection layer 123 may be performed.

According to one or more embodiments, the pixel electrode 221 may be formed by etching the fourth pattern material 1500M in the display area DA. Here, the fourth pattern material 1500M may be etched by wet etching. However, the present disclosure is not limited thereto. The fourth pattern material 1500M may be etched by dry etching.

Also, while the fourth pattern material 1500M in the display area DA is etched, the fourth pattern material 1500M in the adhesion area AA and the remaining portions of the first protection layer 123 may be removed together. Thus, the pixel electrode 221 may be formed by etching the fourth pattern material 1500M in the display area DA, and the fourth pattern material 1500M in the adhesion area AA and the remaining portions of the first protection layer 123 may be removed.

According to one or more embodiments, because the remaining portions of the first protection layer 123 may be removed, only the cover layer 121 of the protection layer 120 may be arranged on the conductive pattern 110. The cover layer 121 may cover the side surface 110*s* of the conductive pattern 110 and at least a portion of the upper surface 110*u* of the conductive pattern 110. In detail, the cover layer 121 may cover the side surface 111*s* of the first conductive layer 111, the side surface 113*s* of the second conductive layer 113, the side surface 115*s* of the third conductive layer 115, and at least a portion of the upper surface 115*u* of the third conductive layer 115.

As illustrated in FIG. 7, after removing a portion of the protection layer 120, an operation of forming the first inorganic encapsulation layer 310 (see, e.g., FIG. 7) and the second inorganic encapsulation layer 330 (see, e.g., FIG. 7) on the cover layer 121 may further be performed.

In detail, after removing a portion of the protection layer 120, the pixel-defining layer 215 (see, e.g., FIG. 4) may be formed on the pixel electrode 221 in the display area DA. Also, the intermediate layer 222 (see, e.g., FIG. 4) and the opposite electrode 223 (see, e.g., FIG. 4) may be sequentially formed on the pixel-defining layer 215 and the pixel electrode 221 in the display area DA.

Thereafter, the encapsulation layer 300 (see, e.g., FIGS. 4 and 7) may be formed on the opposite electrode 223 in the display area DA and on the cover layer 121 in the adhesion area AA. In detail, the first inorganic encapsulation layer 310 may be formed on the opposite electrode 223 in the display area DA and on the cover layer 121 in the adhesion area AA. Thereafter, the organic encapsulation layer 320 may be formed on the first inorganic encapsulation layer 310 in the display area DA. Thereafter, the second inorganic encapsulation layer 330 may be formed on the organic encapsulation layer 320 in the display area DA and on the first inorganic encapsulation layer 310 in the adhesion area AA.

Thus, the first inorganic encapsulation layer 310 and the second inorganic encapsulation layer 330 may be formed on the cover layer 121 in the adhesion area AA. The first inorganic encapsulation layer 310 in the adhesion area AA may directly contact the cover layer 121 and the second inorganic encapsulation layer 330.

As described above, according to the one or more of the embodiments of the present disclosure, a display apparatus, in which a peripheral area at a bottom portion of the display apparatus may be minimized, may be realized. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:

a substrate including a display area and a peripheral area outside the display area, the peripheral area including an adhesion area;

a conductive pattern in the adhesion area;

a cover layer covering at least a portion of an upper surface of the conductive pattern and a side surface of the conductive pattern, the side surface being at an end surface of the conductive pattern; and an encapsulation layer in the display area and the peripheral area, the encapsulation layer comprising a first inorganic encapsulation layer, an organic encapsulation layer, and a second inorganic encapsulation layer, wherein the first inorganic encapsulation layer directly contacts the cover layer and the second inorganic encapsulation layer in the adhesion area.

2. The display apparatus of claim 1, wherein the conductive pattern extends in a first direction, and the conductive pattern comprises protrusion patterns protruding in a second direction crossing the first direction.

3. The display apparatus of claim 1, further comprising a dam portion and a bank in the peripheral area, wherein the adhesion area is between the dam portion and the bank.

4. The display apparatus of claim 1, further comprising:

a first connection pattern in the display area;

a first organic insulating layer on the first connection pattern;

a second connection pattern on the first organic insulating layer;

a second organic insulating layer on the second connection pattern;

a third connection pattern on the second organic insulating layer; and a third organic insulating layer on the third connection pattern.

5. The display apparatus of claim 4, wherein the conductive pattern is at a same layer as the first connection pattern, the second connection pattern, or the third connection pattern.

6. The display apparatus of claim 4, wherein the conductive pattern is at a same layer as the first connection pattern.

7. The display apparatus of claim 4, wherein the conductive pattern comprises a first conductive layer, a second conductive layer, and a third conductive layer that are sequentially stacked, the first connection pattern comprises a first layer, a second layer, and a third layer that are sequentially stacked, and the first conductive layer, the second conductive layer, and the third conductive layer are at same layers and comprise same materials as the first layer, the second layer, and the third layer, respectively.

8. The display apparatus of claim 7, wherein the cover layer contacts a side surface of the first conductive layer, a side surface of the second conductive layer, a side surface of the third conductive layer, and at least a portion of an upper surface of the third conductive layer.

9. The display apparatus of claim 7, wherein the third conductive layer and the cover layer comprise a same material as each other.

10. The display apparatus of claim 7, wherein the second connection pattern comprises a fourth layer, a fifth layer, and a sixth layer that are sequentially stacked, and the cover layer comprises a same material as the fourth layer.

11. A method of manufacturing a display apparatus, the method comprising:

supplying a substrate including a display area and a peripheral area outside the display area, the peripheral area including an adhesion area;

forming a first pattern material in the display area and the adhesion area;

forming a first connection pattern by etching the first pattern material in the display area and forming a conductive pattern by etching the first pattern material in the adhesion area;

forming a first organic insulating layer on the first connection pattern;

forming a second pattern material on the first organic insulating layer and the conductive pattern;

forming a second connection pattern by etching the second pattern material on the first organic insulating layer and forming a protection layer by etching the second pattern material on the conductive pattern; and removing a portion of the protection layer, the protection layer comprising a cover layer and the cover layer covering at least a portion of an upper surface of the conductive pattern and a side surface of the conductive pattern, the side surface being at an end surface of the conductive pattern;

forming an encapsulation layer in the display area and the peripheral area, the encapsulation layer comprising a first inorganic encapsulation layer, an organic encapsulation layer, and a second inorganic encapsulation layer, wherein the first inorganic encapsulation layer directly contacts the cover layer and the second inorganic encapsulation layer in the adhesion area.

12. The method of claim 11, wherein the protection layer comprises the cover layer, a first protection layer, and a second protection layer that are sequentially stacked in a thickness direction of the substrate.

13. The method of claim 12, wherein the removing of the portion of the protection layer comprises:

forming a second organic insulating layer on the second connection pattern;

forming a third pattern material on the second organic insulating layer and the protection layer;

forming a third connection pattern by etching the third pattern material on the second organic insulating layer and removing the third pattern material on the protection layer, the second protection layer of the protection layer, and a portion of the first protection layer of the protection layer;

forming a third organic insulating layer on the third connection pattern;

forming a fourth pattern material on the third organic insulating layer and the first protection layer; and forming a pixel electrode by etching the fourth pattern material on the third organic insulating layer and removing the fourth pattern material on the first protection layer and remaining portions of the first protection layer.

14. The method of claim 12, wherein the cover layer and the second protection layer comprise a same material as each other, and the cover layer and the first protection layer comprise different materials from each other.

15. The method of claim 12, further comprising, after removing the portion of the protection layer, forming the first inorganic encapsulation layer and the second inorganic encapsulation layer on the cover layer.

16. The method of claim 12, wherein the conductive pattern comprises a first conductive layer, a second conductive layer, and a third conductive layer that are sequentially stacked, and the cover layer covers a side surface of the first conductive layer, a side surface of the second conductive layer, a side surface of the third conductive layer, and at least a portion of an upper surface of the third conductive layer.

17. The method of claim 16, wherein the cover layer and the third conductive layer comprise a same material as each other.

18. The method of claim 11, wherein the conductive pattern extends in a first direction, and the conductive pattern comprises protrusion patterns protruding in a second direction crossing the first direction.

19. The method of claim 11, further comprising a dam portion and a bank in the peripheral area, wherein the adhesion area is between the dam portion and the bank.

* * * * *